(12) United States Patent
Ichinose

(10) Patent No.: US 6,211,573 B1
(45) Date of Patent: Apr. 3, 2001

(54) SEMICONDUCTOR DEVICE WITH AN IMPROVED LEAD-CHIP ADHESION STRUCTURE AND LEAD FRAME TO BE USED THEREFOR

(75) Inventor: Michihiko Ichinose, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/096,498

(22) Filed: Jun. 12, 1998

(30) Foreign Application Priority Data

Jun. 12, 1997 (JP) ..................................................... 9-155090

(51) Int. Cl.[7] ........................... H01L 23/48; H01L 23/52; H01L 29/40
(52) U.S. Cl. ........................... 257/783; 257/676; 257/735; 438/118
(58) Field of Search .................................... 257/676, 735, 257/783; 438/118

(56) References Cited

U.S. PATENT DOCUMENTS

| | | |
|---|---|---|
| 5,072,280 | 12/1991 | Matsukura . |
| 5,334,803 * | 8/1994 | Yamamura et al. ................ 174/52.4 |
| 5,428,247 * | 6/1995 | Sohn et al. ............................ 257/676 |
| 5,548,160 | 8/1996 | Corbett et al. . |
| 5,612,569 | 3/1997 | Murakami et al. . |
| 5,834,837 * | 11/1998 | Song .................................... 257/692 |

FOREIGN PATENT DOCUMENTS

| | | |
|---|---|---|
| 0 750 342 | 12/1996 | (EP) . |
| 0 840 375 | 5/1998 | (EP) . |
| 9-82846 | 3/1997 | (JP) . |
| 10-32303 | 2/1998 | (JP) . |

OTHER PUBLICATIONS

Derwent and JPAB translations of the Abstract of JP 10–032303, Feb. 3, 1998.*

* cited by examiner

*Primary Examiner*—Olik Chaudhuri
*Assistant Examiner*—Howard Weiss
(74) *Attorney, Agent, or Firm*—Young & Thompson

(57) ABSTRACT

There is provided an adhering structure between a semiconductor chip and two alignments of first side inner leads and second side inner leads extending in first and second sides of the semiconductor chip respectively. Each of the first and second side inner leads has a stitched portion. The first and second sides are separated by a center line of the semiconductor chip. The semiconductor chip and the first and second side inner leads are adhered to each other by first and second side electrically insulative adhesive tapes respectively. Each of the first and second side electrically insulative adhesive tapes has both surfaces with adhesion force. The first and second side electrically insulative adhesive tapes extend on first and second inner stripe regions so as to adhere the stitched portions of the first and second side inner leads respectively. It is also important that each of the first and second side electrically insulative adhesive tapes is further present in at least two positions which are spaced from each other in a direction parallel to the center line and which are also located in the vicinity of an edge of the semiconductor chip, where the edge extends substantially in parallel to the center line, so that the inner leads, which extend through the two positions, are also fixed in the vicinity of the edge of the semiconductor chip.

39 Claims, 35 Drawing Sheets

SEMICONDUCTOR DEVICE WITH AN IMPROVED LEAD-CHIP ADHESION STRUCTURE AND LEAD FRAME TO BE USED THEREFOR

BACKGROUND OF THE INVENTION

The present invention relates to a semiconductor device with an improved lead-hip adhesion structure and a lead frame, and more particularly to a semiconductor device with a lead-on-chip structure and a lead frame to be used therefor.

FIG. 1 is a fragmentary cross sectional elevation view illustrative of a conventional lead-on-chip structure of a semiconductor device. Inner leads 1 extend over a top surface of a semiconductor chip 4. The inner leads 1 have stitch portions 2 at inside edges thereof. An insulative adhesive tape 3 is adhered with bottom surfaces of the stitch portions 2 of the inner leads 1 aligned in the left side. Another insulative adhesive tape 3 is adhered with bottom surfaces of the stitch portions 2 of the inner leads 1 aligned in the right side. Each of the insulative adhesive tapes 3 has both surfaces on which an insulative adhesive agent has been applied. Alternatively, each of the insulative adhesive tapes 3 has both surfaces on which adhesive layers have been formed. The inner leads 1 extend toward a center line of the semiconductor chip 4. The semiconductor chip 4 is bonded or adhered with the bottom surfaces of the insulative adhesive tapes 3, wherein the insulative adhesive tapes 3 have already been adhered to the bottom surfaces of the stitch portions 2 of the inner leads 1. The semiconductor chip 4 has two alignments of bonding pads 10 along the center line so that individual bonding pads correspond to individual inner leads 1 as illustrated in FIG. 2. The two alignments of bonding pads 10 of the semiconductor chip 4 are positioned inside of the stitch portions 2 of the inner leads 1 and also the insulative adhesive tapes 3. The stitch portion 2 of the inner lead 1 is bonded through a bonding wire 5 to the corresponding bonding pad 10 formed on the semiconductor chip 4 so that the inner leads 1 are electrically connected through the bonding wires 5 to the corresponding bonding pads 10 formed on the semiconductor chip 4.

FIG. 3 is a fragmentary cross sectional elevation view illustrative of the above conventional lead-on-chip structure of the semiconductor device, wherein inner leads are in contact with edges of the semiconductor chip 4 to describe a first problem with the above conventional lead-on-chip structure. As shown in FIG. 3, the inner leads 1 are fixed at the stitch portions 2 by the insulative adhesive tapes 3 but other portions of the inner leads 1 positioned outside of the stitch portions 2 are not fixed. The semiconductor chip 4 is mounted on a printed circuit board by use of a sealing resin wherein a heat is applied to the semiconductor chip 4 and the inner leads 1. The insulative adhesive tapes 3 have a different thermal expansion coefficient from that of the sealing resin, for which reason a stress is generated by the difference in thermal expansion coefficient between the insulative adhesive tapes 3 and the sealing resin. The stress is applied between the insulative adhesive tapes 3 and the sealing resin, whereby a pealing may be generated between the insulative adhesive tapes 3 and the sealing resin. In order to avoid this problem with pealing between the insulative adhesive tapes 3 and the scaling resin, it is effective to narrow the width of the insulative adhesive tapes 3 as much as possible. In the above viewpoints, it is preferable that a pair of possible slender insulative adhesive tapes 3 are provided so that when the semiconductor chip 4 has been bonded to the bottom surfaces of the insulative adhesive tapes 3, the possible slender insulative adhesive tapes 3 are positioned along the two alignments of the bonding pads 10 formed on the semiconductor chip 4 as closely to the two alignments of the bonding pads 10, so as to shorten the length of the individual bonding wires 10. The long bonding wires have a problem with unstability in shape thereof and also is likely to be deformed by a flow of molten sealing resin when the sealing resin is injected tbereunto. For those reasons, it is preferable to shorten the length of the bonding wire 10. This requires that the stitch portion 2 of the inner lead 1 is positioned as closely to the bonding pad 10 provided close to the center line of the semiconductor chip 4 as possible. This results in that a long part of the inner lead 1 positioned outside of the stitch portion 2 extends over the semiconductor chip 4. This is remarkable as the size of the semiconductor chip 4 becomes large. The long part of the inner lead 1 positioned outside of the stitch portion 2 is not fixed by the insulative adhesive tapes 3. Namely, the long inner lead 1 extending over the semiconductor chip 4 is fixed only at the stitch portion 2 thereof by the slender insulative adhesive tape 3. For those reasons, even if a slight deformation appears to such the inner lead 1 when the scaling resin is injected, the inner lead 1 might be made into contact with the edge of the semiconductor chip 4. The likelihood of contact between the inner lead 1 and the edge of the semiconductor chip 4 is high as the size of the semiconductor chip 4 is large.

The above conventional lead-on-chip structure of the semiconductor device is further engaged with a second problem with likelihood of exposure of the tops of the bonding wires 5 or the bottom surface of the semiconductor chip 4 from the sealing resin even after the semiconductor device has been packaged with the sealing resin. As described above, the long part of the individual inner lead 1 extends over the semiconductor chip 4 and is not fixed by the slender insulative adhesive tape 3. This allows the semiconductor chip 4 to move or displace in a direction vertical to the surface of the semiconductor chip 4 by the pressure of the sealing resin injected into dies for molding the semiconductor device. FIG. 4A is a fragmentary cross sectional elevation view illustrative of a semiconductor package, wherein the semiconductor chip 4 has been moved upwardly by the pressure of the sealing resin injected into the dies and the tops of the bonding wires 5 are shown from the sealing resin. FIG. 4B is a fragmentary cross sectional elevation view illustrative of a semiconductor package, wherein the semiconductor chip 4 has been moved downwardly by the pressure of the sealing resin injected into the dies and the bottom surface of the semiconductor chip 4 is shown from the sealing resin. Once either the top of the bonding wire 5 or the bottom of the semiconductor chip 4 is exposed from the sealing resin as illustrated in FIG. 4A or 4B, then a reliability of packaging is remarkably deteriorated and it may no longer be possible to use such the semiconductor package. Namely, the above conventional lead-on-chip structure may result in remarkable drop of the yield of the products.

In order to avoid the above problem with movement of the semiconductor chip 4 by pressure of the molten resin injected into the dies, it is required to select an optimum condition for injection of the resin into the dies. Actually, however, the available ranges of the condition for the injection such as injection speed are extremely narrow. Determination of the available ranges of the condition for the injection is time consuming and complicated procedures. Further, the available ranges of the condition for the injection are changed even by a slight variation in lot of the resin.

This means it required to newly set or determine the optimum condition or extremely narrow available range even when the lot of the resin is changed.

The above lead-on-chip structure is also engaged with the following third problem. Even if the tops of the bonding wires 5 or the bottom of the semiconductor chip 4 are not exposed from the sealing resin, movement or shift in vertical direction to the surface of the semiconductor chip 4 results in variation in thickness of the resin from predetermined thicknesses. A balance is lost in thickness between an upper portion of the resin overlying the semiconductor chip 4 and a lower portion of the resin underlying the semiconductor chip 4. As a result, the semiconductor package may be bent or arched. Further, a reduction in thickness of the upper or lower portion of the resin results in a drop of strength. If a stress is concentrated into the thickness-reduced portion of the resin, a crack is likely to appear on the thickness-reduced portion of the resin.

In addition to the above lead-on-chip structure of the semiconductor device, the subsequent description will focus on a chip-on-lead structure of the semiconductor device. FIG. 5A is a fragmentary cross sectional elevation view illustrative of a conventional chip-on-lead structure of a semiconductor device. Inner leads 1 extend under a bottom surface of a semiconductor chip 4. The inner leads 1 have stitch portions 2 at inside edges thereof. An insulative adhesive tape 3 is adhered with top surfaces of the stitch portions 2 of the inner leads 1 aligned in the left side. Another insulative adhesive tape 3 is adhered with top surfaces of the stitch portions 2 of the inner leads 1 aligned in the right side. Each of the insulative adhesive tapes 3 has both surfaces on which an insulative adhesive agent has been applied. Alternatively, each of the insulative adhesive tapes 3 has both surfaces on which adhesive layers have been formed. The inner leads 1 extend toward a center line of the semiconductor chip 4. The semiconductor chip 4 is bonded or adhered with the top surfaces of the insulative adhesive tapes 3, wherein the insulative adhesive tapes 3 have already been adhered to the top surfaces of the stitch portions 2 of the inner leads 1. The semiconductor chip 4 has two alignments of bonding pads 10 along opposite sides of the semiconductor chip 4 so that individual bonding pads 10 correspond to individual inner leads 1. The stitch portion 2 of the inner lead 1 is bonded through a bonding wire 5 to the corresponding bonding pad 10 formed on the top surface of the semiconductor chip 4 so that the inner leads 1 are electrically connected through the bonding wires 5 to the corresponding bonding pads 10.

FIG. 5B is a fragmentary cross sectional elevation view illustrative of the above conventional lead-on-chip structure of the semiconductor device, wherein inner leads 1 are in contact with edges of the semiconductor chip 4 to describe the same problem as engaged with the above conventional lead-on-chip structure. As shown in FIG. 5B, the inner leads 1 are fixed at the stitch portions 2 by the insulative adhesive tapes 3 but other portions of the inner leads 1 positioned outside of the stitch portions 2 are not fixed. The semiconductor chip 4 is mounted on a printed circuit board by use of a scaling resin wherein a heat is applied to the semiconductor chip 4 and the inner leads 1. The insulative adhesive tapes 3 have a different thermal expansion coefficient from that of the sealing resin, for which reason a stress is generated by the difference in thermal expansion coefficient between the insulative adhesive tapes 3 and the sealing resin. The stress is applied between the insulative adhesive tapes 3 and the sealing resin, whereby a pealing may be generated between the insulative adhesive tapes 3 and the sealing resin.

In order to avoid this problem with pealing between the insulative adhesive tapes 3 and the sealing resin, it is effective to narrow the width of the insulative adhesive tapes 3 as much as possible. In the above viewpoints, it is preferable that a pair of possible slender insulative adhesive tapes 3 are provided so that when the semiconductor chip 4 has been bonded to the bottom surfaces of the insulative adhesive tapes 3, the possible slender insulative adhesive tapes 3 are positioned relatively close to the center line of the semiconductor chip 4. This results in that a long part of the inner lead 1 positioned outside of the stitch portion 2 extends over the semiconductor chip 4. This is remarkable as the size of the semiconductor chip 4 becomes large. The long part of the inner lead 1 positioned outside of the stitch portion 2 is not fixed by the insulative adhesive tapes 3. Namely, the long inner lead 1 extending over the semiconductor chip 4 is fixed only at the stitch portion 2 thereof by the slender insulative adhesive tape 3. For those reasons, even if a slight deformation appears to such the inner lead 1 when the sealing resin is injected, the inner lead 1 might be made into contact with the edge of the semiconductor chip 4. The likelihood of contact between the inner lead 1 and the edge of the semiconductor chip 4 is high as the size of the semiconductor chip 4 is large.

The above conventional lead-on-chip structure of the semiconductor device is further engaged with a second problem with likelihood of exposure of the tops of the bonding wires 5 or the bottom surface of the stitched portion 2 of the inner lead 1 from the sealing resin even after the semiconductor device has been packaged with the sealing resin. As described above, the long part of the individual inner lead 1 extends under the semiconductor chip 4 and is not fixed by the slender insulative adhesive tape 3. This allows the semiconductor chip 4 to move or displace in a direction vertical to the surface of the semiconductor chip 4 by the pressure of the sealing resin injected into dies for molding the semiconductor device. Once either the top of the bonding wire 5 or the bottom of the stitched portion 2 of the inner lead 1 is exposed from the sealing resin, then a reliability of packaging is remarkably deteriorated and it may no longer be possible to use such the semiconductor package. Namely, the above conventional lead-on-chip structure may result in remarkable drop of the yield of the products.

In order to avoid the above problem with movement of the semiconductor chip 4 by pressure of the molten resin injected into the dies, it is required to select an optimum condition for injection of the resin into the dies. Actually, however, the available ranges of the conditions for the injection such as injection speed are extremely narrow. Determination of the available ranges of the condition for the injection is time consuming and complicated procedures. Further, the available ranges of the condition for the injection are changed even by a slight variation in lot of the resin. This means it required to newly set or determine the optimum condition or extremely narrow available range even when the lot of the resin is changed.

The above chip-on-lead structure is also engaged with the following third problem. Even if the tops of the bonding wires 5 or the bottom of the stitched portions 2 of the inner leads 1 are not exposed from the sealing resin, movement or shift in vertical direction to the surface of the semiconductor chip 4 results in variation in thickness of the resin from predetermined thicknesses. A balance is lost in thickness between an upper portion of the resin overlying the semiconductor chip 4 and a lower portion of the resin underlying the semiconductor chip 4. As a result, the semiconductor package may be bent or arched. Further, a reduction in thickness of the upper or lower portion of the resin results in a drop of strength. If a stress is concentrated into the thickness-reduced portion of the resin, a crack is likely to appear on the thickness-reduced portion of the resin.

In the above circumstances, it had been required to develop a novel lead-on-chip structure of a semiconductor device free from the above problems and a lead frame to be used therefor, in addition a novel chip-on-lead structure of a semiconductor device free from the above problems and a lead frame to be used therefor.

SUMMARY OF THE INVENTION

Accordingly, it is an object of the present invention to provide a novel lead-on-chip structure of a semiconductor device free from the above problems.

It is a further object of the present invention to provide a novel lead-on-chip structure of a semiconductor device, which is capable of preventing any contact between an inner lead and an edge portion of a semiconductor chip.

It is a still further object of the present invention to provide a novel lead-on-chip structure of a semiconductor device, which is capable of keeping a constant distance between a semiconductor chip and an inner lead extending over the semiconductor chip.

It is yet a further object of the present invention to provide a novel lead-on-chip structure of a semiconductor device, which is capable of preventing any substantive movement or shift in a direction vertical to the surface of the semiconductor chip by pressure of a molten resin injected into dies for packaging the semiconductor device.

It is a farther more object of the present invention to provide a novel lead-on-chip structure of a semiconductor device, which is capable of preventing exposure of tops of bonding wires by substantive movement or shift in a direction vertical to the surface of the semiconductor chip by pressure of a molten resin injected into dies for packaging the semiconductor device.

It is still more object of the present invention to provide a novel lead-on-chip structure of a semiconductor device, which is capable of preventing a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is moreover object of the present invention to provide a novel lead-on-chip structure of a semiconductor device, which is capable of preventing appearance of crack on a thickness-reduced portion of a resin due to a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is another object of the present invention to provide a novel lead-on-chip structure of a semiconductor device which allows a high yield of manufacturing.

It is still another object of the present invention to provide a novel lead-on-chip structure of a semiconductor device which has a high reliability.

It is yet another object of the present invention to provide a novel lead frame for a lead-on-chip structured semiconductor device free from the above problems.

It is further another object of the present invention to provide a novel lead frame for a lead-on-chip structured semiconductor device, which is capable of preventing any contact between an inner lead and an edge portion of a semiconductor chip.

It is an additional object of the present invention to provide a novel lead frame for a lead-on-chip structured semiconductor device, which is capable of keeping a constant distance between a semiconductor chip and an inner lead extending over the semiconductor chip.

It is a still additional object of the present invention to provide a novel lead frame for a lead-on-chip structured semiconductor device, which is capable of preventing any substantive movement or shift in a direction vertical to the surface of the semiconductor chip by pressure of a molten resin injected into dies for packaging the semiconductor device.

It is yet an additional object of the present invention to provide a novel lead frame for a lead-on-chip structured semiconductor device, which is capable of preventing exposure of tops of bonding wires by substantive movement or shift in a direction vertical to the surface of the semiconductor chip by pressure of a molten resin injected into dies for packaging the semiconductor device.

It is a further additional object of the present invention to provide a novel lead frame for a lead-on-chip structured semiconductor device, which is capable of preventing a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also additional object of the present invention to provide a novel lead frame for a lead-on-chip structured semiconductor device, which is capable of preventing appearance of crack on a thickness-reduced portion of a resin due to a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also additional object of the present invention to provide a novel lead frame for a lead-on-chip structured semiconductor device which allows a high yield of manufacturing.

It is also additional object of the present invention to provide a novel lead-on-chip structure of a semiconductor device which has a high reliability.

It is also an object of the present invention to provide a novel chip-on-lead structure of a semiconductor device free from the above problems.

It is also an object of the present invention to provide a novel chip-on-lead structure of a semiconductor device, which is capable of preventing any contact between an inner lead and an edge portion of a semiconductor chip.

It is also an object of the present invention to provide a novel chip-on-lead structure of a semiconductor device, which is capable of keeping a constant distance between a semiconductor chip and an inner lead extending over the semiconductor chip.

It is also an object of the present invention to provide a novel chip-on-lead structure of a semiconductor device, which is capable of preventing any substantive movement or shift in a direction vertical to the surface of the semiconductor chip by pressure of a molten resin injected into dies for packaging the semiconductor device.

It is also an object of the present invention to provide a novel chip-on-lead structure of a semiconductor device, which is capable of preventing exposure of tops of bonding wires by substantive movement or shift in a direction vertical to the surface of the semiconductor chip by pressure of a molten resin injected into dies for packaging the semiconductor device.

It is also an object of the present invention to provide a novel chip-on-lead structure of a semiconductor device, which is capable of preventing a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also an object of the present invention to provide a novel chip-on-lead structure of a semiconductor device, which is capable of preventing appearance of crack on a thickness-reduced portion of a resin due to a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also an object of the present invention to provide a novel chip-on-lead structure of a semiconductor device which allows a high yield of manufacturing.

It is also an object of the present invention to provide a novel chip-on-lead structure of a semiconductor device which has a high reliability.

It is also an object of the present invention to provide a novel lead frame for a chip-on-lead structured semiconductor device free from the above problems.

It is also an object of the present invention to provide a novel lead frame for a chip-on-lead structured semiconductor device, which is capable of preventing any contact between an inner lead and an edge portion of a semiconductor chip.

It is also an object of the present invention to provide a novel lead frame for a chip-on-lead structured semiconductor device, which is capable of keeping a constant distance between a semiconductor chip and an inner lead extending over the semiconductor chip.

It is also an object of the present invention to provide a novel lead frame for a chip-on-lead structured semiconductor device, which is capable of preventing any substantive movement or shift in a direction vertical to the surface of the semiconductor chip by pressure of a molten resin injected into dies for packaging the semiconductor device.

It is also an object of the present invention to provide a novel lead frame for a chip-on-lead structured semiconductor device, which is capable of preventing exposure of tops of bonding wires by substantive movement or shift in a direction vertical to the surface of the semiconductor chip by pressure of a molten resin injected into dies for packaging the semiconductor device.

It is also an object of the present invention to provide a novel lead frame for a chip-on-lead structured semiconductor device, which is capable of preventing a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also an object of the present invention to provide a novel lead frame for a chip-on-lead structured semiconductor device, which is capable of preventing appearance of crack on a thickness-reduced portion of a resin due to a substantive loss of a balance in thickness between upper and lower portions of a sealing resin packaging a semiconductor chip by substantive movement or shift in a direction vertical to the surface of the semiconductor chip by pressure of a molten resin injected into dies for packaging the semiconductor device.

It is also an object of the present invention to provide a novel lead frame for a chip-on-lead structured semiconductor device which allows a high yield of manufacturing.

It is also an object of the present invention to provide a novel chip-on-lead structure of a semiconductor device which has a high reliability.

The first present invention provides an adhering structure between a semiconductor chip and two alignments of first side inner leads and second side inner leads extending in first and second sides of the semiconductor chip respectively. Each of the first and second side inner leads has a stitched portion. The first and second sides are separated by a center line of the semiconductor chip. The semiconductor chip and the first and second side inner leads are adhered to each other by first and second side electrically insulative adhesive tapes respectively. Each of the first and second side electrically insulative adhesive tapes has both surfaces with adhesion force. The first and second side electrically insulative adhesive tapes extend on first and second inner stripe regions so as to adhere the stitched portions of the first and second side inner leads respectively. It is also important that each of the first and second side electrically insulative adhesive tapes is further present in at least two positions which are spaced from each other in a direction parallel to the center line and which are also located in the vicinity of an edge of the semiconductor chip, where the edge extends substantially in parallel to the center line, so that the inner leads, which extend through the two positions, are also fixed in the vicinity of the edge of the semiconductor chip.

In accordance with the present invention, the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip or the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
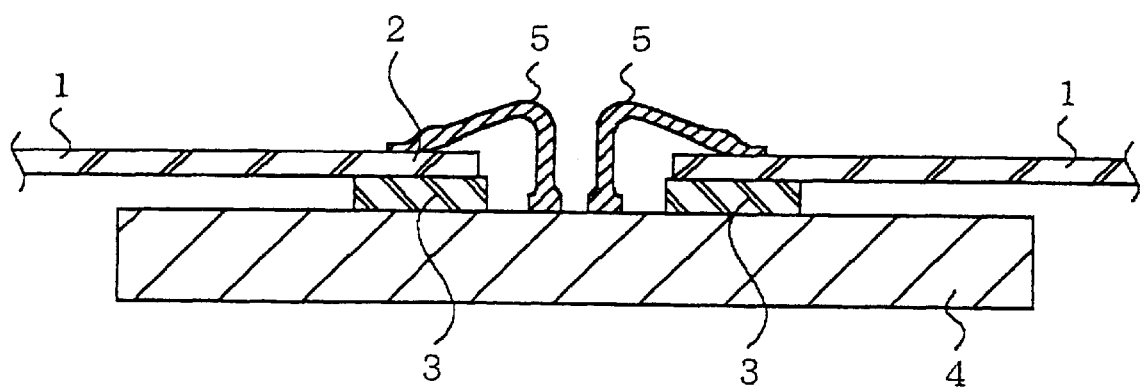
FIG. 1 is a fragmentary cross sectional elevation view illustrative of a conventional lead-on-chip structure of a semiconductor device.
Figure 2:
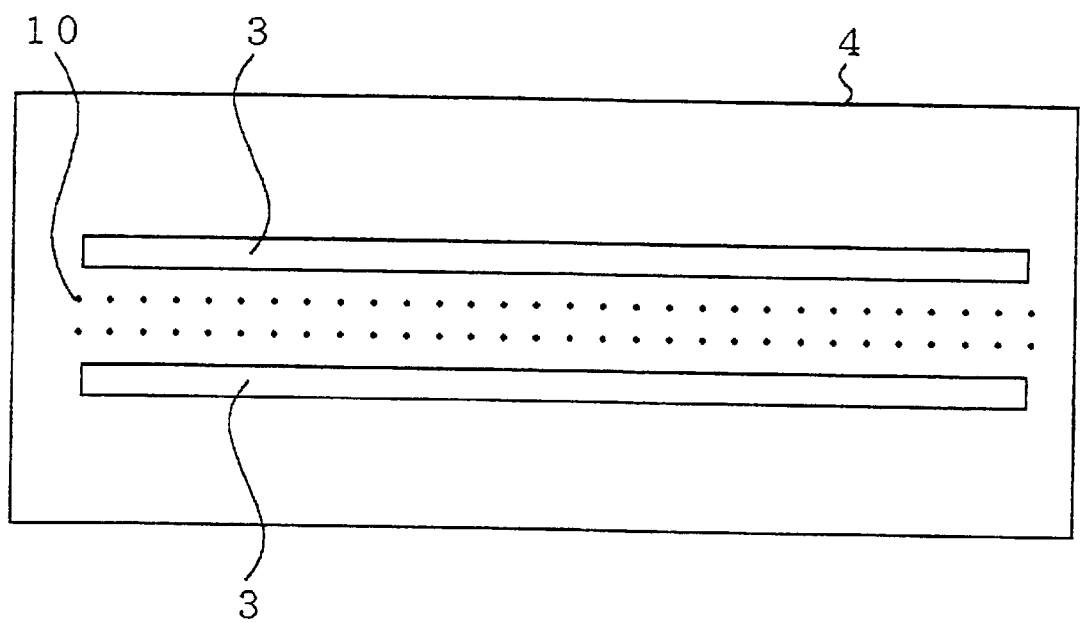
FIG. 2 is a schematic plane view illustrative of a semiconductor chip on which a pair of slender stripe adhesive tapes are provided along just opposite outsides of two alignments of bonding pads provided on the semiconductor chip.
Figure 3:
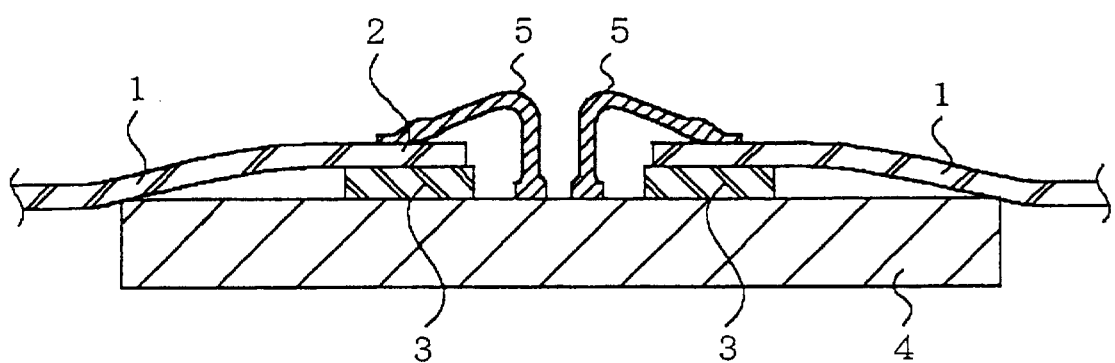
FIG. 3 is a fragmentary cross sectional elevation view illustrative of the above conventional lead-on-chip structure of the semiconductor device, wherein inner leads are in contact with edges of the semiconductor chip to describe the first problem with the above conventional lead-on-chip structure.
Figure 4A:
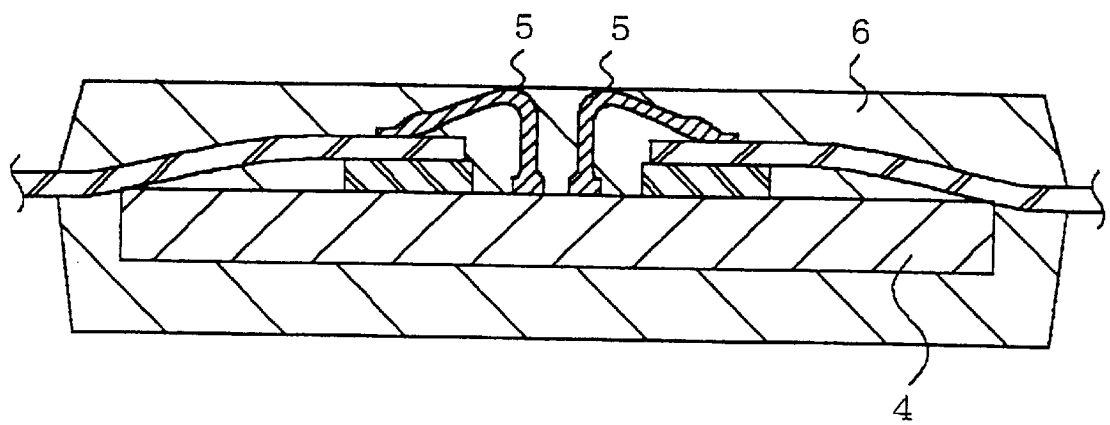
FIG. 4A is a fragmentary cross sectional elevation view illustrative of a semiconductor package, wherein the semiconductor chip has been moved upwardly by the pressure of the sealing resin injected into the dies and the tops of the bonding wires are shown from the sealing resin.
Figure 4B:
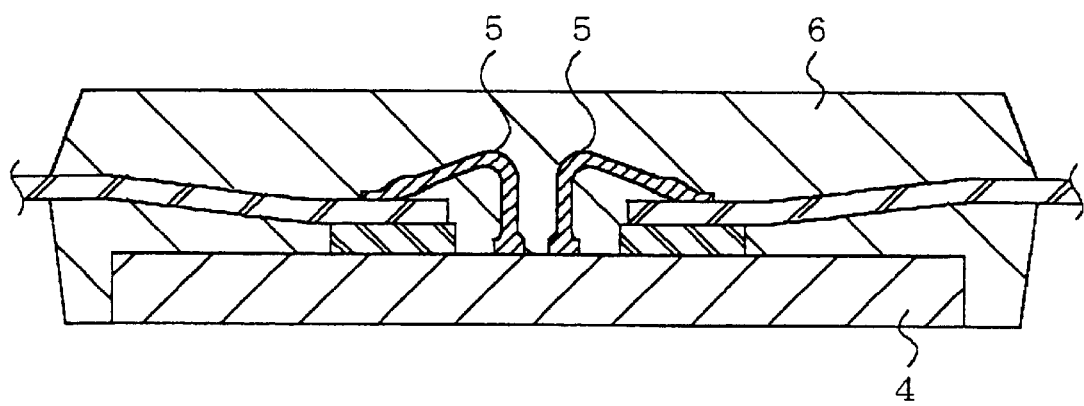
FIG. 4B is a fragmentary cross sectional elevation view illustrative of a semiconductor package, wherein the semiconductor chip has been moved downwardly by the pressure of the sealing resin injected into the dies and the bottom surface of the semiconductor chip is shown from the sealing resin.
Figure 5A:
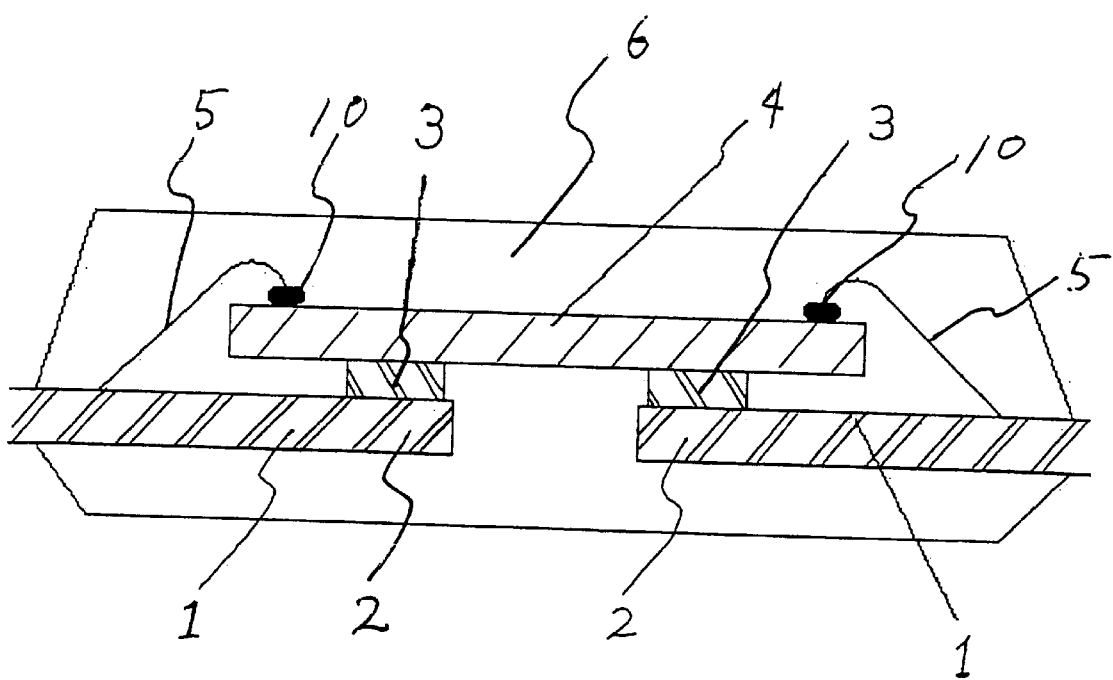
FIG. 5A is a fragmentary cross sectional elevation view illustrative of a conventional chip-on-lead structure of the semiconductor device.
Figure 5B:
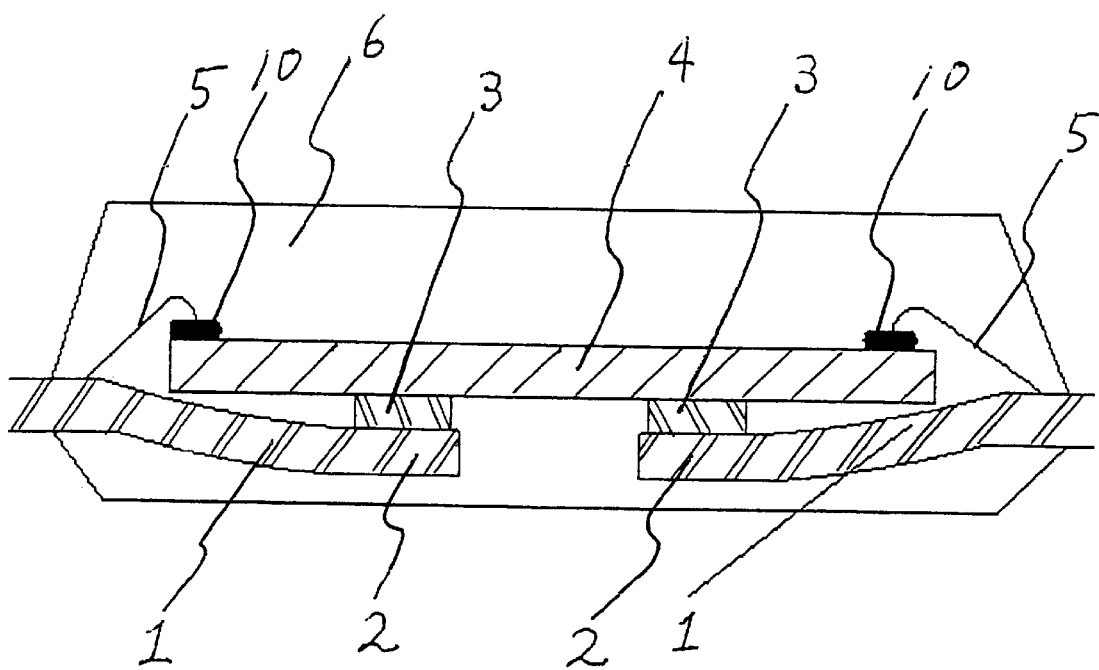
FIG. 5B is a fragmentary cross sectional elevation view illustrative of the above conventional lead-on-chip structure of the semiconductor device, wherein inner leads are in contact with edges of the semiconductor chip to describe the same problem as engaged with the above conventional lead-on-chip structure.

The first present invention provides an adhering structure between a semiconductor chip and two alignments of first side inner leads and second side inner leads extending in first and second sides of the semiconductor chip respectively. Each of the first and second side inner leads has a stitched portion. The first and second sides are separated by a center line of the semiconductor chip. The semiconductor chip and the first and second side inner leads are adhered to each other by first and second side electrically insulative adhesive tapes respectively. Each of the first and second side electrically insulative adhesive tapes has both surfaces with adhesion force. The first and second side electrically insulative adhesive tapes extend on first and second inner stripe regions so as to adhere the stitched portions of the first and second side inner leads respectively. It is also important that each of the first and second side electrically insulative adhesive tapes is further present in at least two positions which are spaced from each other in a direction parallel to the center line and which are also located in the vicinity of an edge of the semiconductor chip, where the edge extends substantially in parallel to the center line, so that the inner leads, which extend through the two positions, are also fixed in the vicinity of the edge of the semiconductor chip.

In accordance with the present invention, the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip or the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

In practice, it is preferable that each of the first and second side electrically insulative adhesive tapes is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region in the vicinity of and in parallel to the edge of the semiconductor chip, where the outer stripe region is separated from the inner stripe region, and an outside edge of the each of the first and second side electrically insulative adhesive tapes is positioned inside of the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region along the edge of the semiconductor chip, where the outer stripe region is separated from the inner stripe region, and an outside edge of the each of the first and second side electrically insulative adhesive tapes is positioned in correspondence to the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes continuously extends from the inner stripe region to the outer stripe region in the vicinity of and in parallel to the edge of the semiconductor chip so that an outside edge of the each of the first and second side electrically insulative adhesive tapes is positioned inside of the edge of the semiconductor chip. If an adhesion force of the electrically insulative adhesive tape with the sealing resin is sufficiently strong, there is raised no problem with increase in contact area between the electrically insulative adhesive tape and the sealing resin.

It is also preferable that each of the first and second side electrically insulative adhesive tapes continuously extends from the inner stripe region through the edge of the semiconductor chip so that an outside edge of the each of the first and second side electrically insulative adhesive tapes is positioned in correspondence to the edge of the semiconductor chip. If an adhesion force of the electrically insulative adhesive tape with the sealing resin is sufficiently strong, there is raised no problem with increase in contact area between the electrically insulative adhesive tape and the sealing resin.

The second present invention provides an electrically insulative adhesive tape structure to be used for adhering a semiconductor chip with inner leads. The inner leads extend substantially in parallel to each other. The inner leads are aligned in a direction substantially in parallel to an edge of the semiconductor chip. Each of the inner leads has an inside portion. The semiconductor chip and the inner leads are adhered to each other by the electrically insulative adhesive tape. The electrically insulative adhesive tape has both surfaces with adhesion force. The electrically insulative adhesive tape extends on an inner stripe region so as to adhere the inside portions of the inner leads. It is also important that the electrically insulative adhesive tape is further present in at least two positions which are spaced from each other in a direction parallel to the edge of the semiconductor chip and which are also located in the vicinity of the edge of the semiconductor chip so that the inner leads, which extend through the two positions, are also adhered in the vicinity of the edge of the semiconductor chip.

In accordance with the present invention, the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip or the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

It is preferable that the electrically insulative adhesive tape is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tapes further extend on an outer stripe region in the vicinity of and in parallel to the edge of the semiconductor chip, where the outer stripe region is separated from the inner stripe region, and an outside edge of the electrically insulative adhesive tape is positioned inside of the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape further extends on an outer stripe region along the edge of the semiconductor chip, where the outer stripe region is separated from the inner stripe region, and an outside edge of the electrically insulative adhesive tape is positioned in correspondence to the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape continuously extends from the inner stripe region to the outer stripe region in the vicinity of and in parallel to the edge of the semiconductor chip so that an outside edge of the electrically insulative adhesive tape is positioned inside of the edge of the semiconductor chip. If an adhesion force of the electrically insulative adhesive tape with the sealing resin is sufficiently strong, there is raised no problem with increase in contact area between the electrically insulative adhesive tape and the sealing resin.

It is also preferable that the electrically insulative adhesive tape continuously extends from the inner stripe region through the edge of the semiconductor chip so that an outside edge of the electrically insulative adhesive tape is positioned in correspondence to the edge of the semiconductor chip. If an adhesion force of the electrically insulative adhesive tape with the sealing resin is sufficiently strong, there is raised no problem with increase in contact area between the electrically insulative adhesive tape and the sealing resin.

The third present invention provides a lead-on-chip structure of a semiconductor device packaged with a sealing resin. The lead-on-chip structure comprises the following elements. A semiconductor chip has a top surface which further has two alignments of bonding pads along opposite sides of a center line of the semiconductor chip. The center line separates the semiconductor chip into first and second side regions. First and second alignments of inner leads extend over the first and second side regions of the semiconductor chip respectively so that the inner leads are spaced from the top surface of the semiconductor chip. The inner leads have stitched portions positioned in inside terminal portions thereof. The stitched portions of the inner leads are positioned outside of the bonding pads. The inner leads extend substantially in parallel to each other and along a direction vertical to the center line of the semiconductor chip. Bonding wires electrically connect the stitched portions of the inner leads to corresponding ones of the bonding pads of the semiconductor chip. First and second side electrically insulative adhesive tapes have top and bottom surfaces with adhesion force. The bottom surfaces of the first and second side electrically insulative adhesive tapes are adhered on first and second inner stripe regions of the semiconductor chip. The first and second inner stripe regions are positioned outside of the bonding pads, and also the top surfaces of the first and second side electrically insulative adhesive tapes are adhered on bottom surfaces of the stitched portions of the inner leads, so as to provide adhesions between the stitched portions of the inner leads and the first and second inner stripe regions of the semiconductor chip. It is also important that each of the first and second side electrically insulative adhesive tapes is further present in at least two positions which are spaced from each other in a direction parallel to the center line and which are also located in the vicinity of an edge of the semiconductor chip, where the edge extends substantially in parallel to the center line, so that the inner leads, which extend through the two positions, are also fixed in the vicinity of the edge of the semiconductor chip.

In accordance with the present invention, the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

It is preferable that each of the first and second side electrically insulative adhesive tapes is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region in the vicinity of and in parallel to the edge of the semiconductor chip, where the outer stripe region is separated from the inner stripe region, and an outside edge of the each of the first and second side electrically insulative adhesive tapes is positioned inside of the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region along the edge of the semiconductor chip, where the outer stripe region is separated from the inner stripe region, and an outside edge of the each of the first and second side electrically insulative adhesive tapes is positioned in correspondence to the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes continuously extends from the inner stripe region to the outer stripe region in the vicinity of and in parallel to the edge of the semiconductor chip so that an outside edge of the each of the first and second side electrically insulative adhesive tapes is positioned inside of the edge of the semiconductor chip. If an adhesion force of the electrically insulative adhesive tape with the sealing resin is sufficiently strong, there is raised no problem with increase in contact area between the electrically insulative adhesive tape and the sealing resin.

It is also preferable that each of the first and second side electrically insulative adhesive tapes continuously extends from the inner stripe region through the edge of the semiconductor chip so that an outside edge of the each of the first and second side electrically insulative adhesive tapes is positioned in correspondence to the edge of the semiconductor chip. If an adhesion force of the electrically insulative adhesive tape with the sealing resin is sufficiently strong, there is raised no problem with increase in contact area between the electrically insulative adhesive tape and the sealing resin.

The fourth present invention provides a chip-on-lead structure of a semiconductor device packaged with a sealing resin. The chip-on-lead structure comprises the following elements. A semiconductor chip has a top surface which further has two alignments of bonding pads along opposite sides of the semiconductor chip. The center line separates the semiconductor chip into first and second side regions. First and second alignments of inner leads extend under the first and second side regions of the semiconductor chip respectively so that the inner leads are spaced from a bottom surface of the semiconductor chip. The inner leads have stitched portions positioned in inside terminal portions thereof. The inner leads extend substantially in parallel to each other and along a direction vertical to the center line of the semiconductor chip. Bonding wires electrically connect the inner leads to corresponding ones of the bonding pads of the semiconductor chip. First and second side electrically insulative adhesive tapes have top and bottom surfaces with adhesion force. The top surfaces of the first and second side electrically insulative adhesive tapes are adhered on first and second inner stripe regions of the semiconductor chip, and also the bottom surfaces of the first and second side electrically insulative adhesive tapes are adhered on top surfaces of the stitched portions of the inner leads, so as to provide adhesions between the stitched portions of the inner leads and the first and second inner stripe regions of the semiconductor chip. It is also important that each of the first and second side electrically insulative adhesive tapes is further present in at least two positions which are spaced from each other in a direction parallel to the center line and which are also located in the vicinity of an edge of the semiconductor chip, where the edge extends substantially in parallel to the center line, so that the inner leads, which extend through the two positions, are also fixed in the vicinity of the edge of the semiconductor chip.

In accordance with the present invention, the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

It is preferable that each of the first and second side electrically insulative adhesive tapes is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region in the vicinity of and in parallel to the edge of the semiconductor chip, where the outer stripe region is separated from the inner stripe region, and an outside edge of the each of the first and second side electrically insulative adhesive tapes is positioned inside of the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region along the edge of the semiconductor chip, where the outer stripe region is separated from the inner stripe region, and an outside edge of the each of the first and second side electrically insulative adhesive tapes is positioned in correspondence to the edge of the semiconductor chip.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease a contact area between the electrically insulative adhesive tape with a sealing resin material for packaging the semiconductor chip. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes continuously extends from the inner stripe region to the outer stripe region in the vicinity of and in parallel to the edge of the semiconductor chip so that an outside edge of the each of the first and second side electrically insulative adhesive tapes is positioned inside of the edge of the semiconductor chip. If an adhesion force of the electrically insulative adhesive tape with the sealing resin is sufficiently strong, there is raised no problem with increase in contact area between the electrically insulative adhesive tape and the sealing resin.

It is also preferable that each of the first and second side electrically insulative adhesive tapes continuously extends from the inner stripe region through the edge of the semiconductor chip so that an outside edge of the each of the first and second side electrically insulative adhesive tapes is positioned in correspondence to the edge of the semiconductor chip. If an adhesion force of the electrically insulative adhesive tape with the sealing resin is sufficiently strong, there is raised no problem with increase in contact area between the electrically insulative adhesive tape and the sealing resin.

The fifth present invention provides a lead frame having two alignments of first side inner leads and second side inner leads extending in first and second sides which are separated by a center line along a longitudinal direction of the lead frame. The first side inner leads have stitched portions which are adhered with a first side electrically insulative adhesive tape having both surfaces with adhesion force for adhering with a semiconductor chip. The second side inner leads also have stitched portions which are adhered with a second side electrically insulative adhesive tape having both surfaces with adhesion force for adhering with the semiconductor chip. It is also important that each of the first and second side electrically insulative adhesive tapes is further present in at least two positions which are spaced from each other in a direction parallel to the center line and which are also located outside of the stitched portions of the inner leads and the two positions are located in the vicinity of chip edge correspondence positions of the inner leads, where the chip edge correspondence position is previously determined to correspond to an edge of the semiconductor chip after the semiconductor chip has been adhered to the lead frame by the first and second electrically insulative adhesive tapes.

In accordance with the present invention, the above lead frame allows that the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip or the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability It is preferable that each of the first and second side electrically insulative adhesive tapes is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region over the inner leads in the vicinity of the chip edge correspondence positions, where the outer stripe region is positioned outside of and separated from the stitched portion, and an outside edge of the each of the first and second side electrically insulative adhesive tapes is positioned inside of the chip edge correspondence position.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes further extends on an outer stripe region over the inner leads in the vicinity of the chip edge correspondence positions, where the outer stripe region is positioned outside of and separated from the stitched portion, and an outside edge of the each of the first and second side electrically insulative adhesive tapes is positioned at the chip edge correspondence position.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that each of the first and second side electrically insulative adhesive tapes continuously extends from the stitched portions to an outer stripe region over the inner leads, and the outer stripe region is positioned in the vicinity of the chip edge correspondence position so that an outside edge of the each of the first and second side electrically insulative adhesive tapes is positioned inside of the chip edge correspondence position. If an adhesion force of the electrically insulative adhesive tape with the sealing resin is sufficiently strong, there is raised no problem with increase in contact area between the electrically insulative adhesive tape and the sealing resin.

It is also preferable that each of the first and second side electrically insulative adhesive tapes continuously extends from the stitched portions to the chip edge correspondence position so that an outside edge of the each of the first and second side electrically insulative adhesive tapes is positioned at the chip edge correspondence position. If an adhesion force of the electrically insulative adhesive tape with the sealing resin is sufficiently strong, there is raised no problem with increase in contact area between the electrically insulative adhesive tape and the sealing resin.

The sixth present invention provides an electrically insulative adhesive tape extending over stitched portions of inner leads of a lead frame. The inner leads extend substantially in parallel to each other and being aligned in a direction substantially vertical to a longitudinal direction of the inner leads, so that the electrically insulative adhesive tape extends on an inner stripe region over the inner leads so as to adhere the stitched portions of the inner leads. The electrically insulative adhesive tape have both surfaces with adhesion force. It is also important that the electrically insulative adhesive tape is further present in at least two positions which are spaced from each other in a direction vertical to the longitudinal direction of the inner leads and which are also located outside of the stitched portions of the inner leads and the two positions are located in the vicinity of chip edge correspondence positions of the inner leads, where the chip edge correspondence position is previously determined to correspond to an edge of the semiconductor chip after the semiconductor chip has been adhered to the lead frame by the first and second electrically insulative adhesive tapes.

In accordance with the present invention, the above lead frame allows that the semiconductor chip and the inner leads aligned are fixed by the electrically insulative adhesive tape at a plurality of positions which are distanced from each other to keep a positional balance of fixing points so as to certainly prevent the any substantive movement of the semiconductor chip particularly in the direction vertical to the surface of the semiconductor chip. Namely, the presence of the electrically insulative adhesive tape at least the two positions spaced from each other in the direction parallel to the center line and which are also located in the vicinity of the edge of the semiconductor chip would result in that inner leads, which extend through the two positions, are fixed not only at the stitched portion but also outside portion in the vicinity of the edge of the semiconductor chip. This structure is capable of certainly preventing a substantive movement of the semiconductor chip in a direction vertical to the surface of the semiconductor chip by pressure of the flow of the molten resin when the resin is injected into dies for packaging the semiconductor chip. The certain prevention of the substantive movement of the semiconductor chip would result in a certain prevention of the inner leads from being made into contact with the edge of the semiconductor chip. The certain prevention of the substantive movement of the semiconductor chip would also result in a certain prevention of the top portion of the semiconductor device such as tops of bonding wires from exposure from the sealing resin. The certain prevention of the substantive movement of the semiconductor chip would also result in a certain prevention of the bottom portion of the semiconductor device such as bottom surface of the semiconductor chip or the inner leads from exposure from the sealing resin. The certain prevention of the substantive movement of the semiconductor chip means that the above structure is also capable of keeping a constant distance between the semiconductor chip and the inner lead extending over the semiconductor chip. The certain prevention of the substantive movement of the semiconductor chip also means that the structure is capable of keeping a balance in thickness between upper and lower portions of the sealing resin packaging the semiconductor chip due to no substantive movement nor shift in the direction vertical to the surface of the semiconductor chip. Keeping the balance in thickness between upper and lower portions of the sealing resin prevents formation of any thickness-reduced portion, resulting in a remarkable reduction in the probability in appearance of crack on the thickness-reduced portion of the resin. From the above description, it can be understood that the above novel structure allows a high yield of manufacturing the semiconductor device and also allows the semiconductor device to have a high reliability.

It is preferable that the electrically insulative adhesive tape is further positioned so as to adhere outer-most two of the inner leads.

It is further preferable that the outer-most two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape is further positioned so as to adhere secondly outer two of the inner leads.

It is further preferable that the secondly outer two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tapes is further positioned so as to adhere outer-most two and secondly outer two of the inner leads.

It is further preferable that the outer-most two and the secondly outer two of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape is further positioned so as to adhere outer-most one of the inner leads and secondly outer one in an opposite side to the outer-most one.

It is further preferable that the outer-most one of the inner leads and the secondly outer one in an opposite side to the outer-most one of the inner leads have spread portions which are adhered with the electrically insulative adhesive tape, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape further extends on an outer stripe region over the inner leads in the vicinity of the chip edge correspondence positions, where the outer stripe region is positioned outside of and separated from the stitched portion, and an outside edge of the each of the first and second side electrically insulative adhesive tapes is positioned inside of the chip edge correspondence position.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape further extends on an outer stripe region over the inner leads in the vicinity of the chip edge correspondence positions, where the outer stripe region is positioned outside of and separated from the stitched portion, and an outside edge of the electrically insulative adhesive tape is positioned at the chip edge correspondence position.

It is further preferable that the inner leads have spread portions which are adhered with the electrically insulative adhesive tape, provided that the spread portions of the adjacent two of the inner leads are separated from each other, so as to increase an adhering area between the inner leads and the electrically insulative adhesive tape and decrease an exposed area of the electrically insulative adhesive tape. If an adhesion force of the electrically insulative adhesive tape with the sealing resin is relatively weak, it is particularly effective to reduce the contact area between the electrically insulative adhesive tape and the sealing resin for obtaining a high fixing force between the semiconductor chip and the sealing resin.

It is also preferable that the electrically insulative adhesive tape continuously extends from the stitched portions to an outer stripe region over the inner leads, and the outer stripe region is positioned in the vicinity of the chip edge correspondence position so that an outside edge of the electrically insulative adhesive tape is positioned inside of the chip edge correspondence position. If an adhesion force of the electrically insulative adhesive tape with the sealing resin is sufficiently strong, there is raised no problem with increase in contact area between the electrically insulative adhesive tape and the sealing resin.

It is also preferable that the electrically insulative adhesive tape continuously extends from the stitched portions to the chip edge correspondence position so that an outside edge of the electrically insulative adhesive tape is positioned at the chip edge correspondence position. If an adhesion force of the electrically insulative adhesive tape with the sealing resin is sufficiently strong, there is raised no problem with increase in contact area between the electrically insulative adhesive tape and the sealing resin.

PREFERRED EMBODIMENTS

First Embodiment

Figure 6:
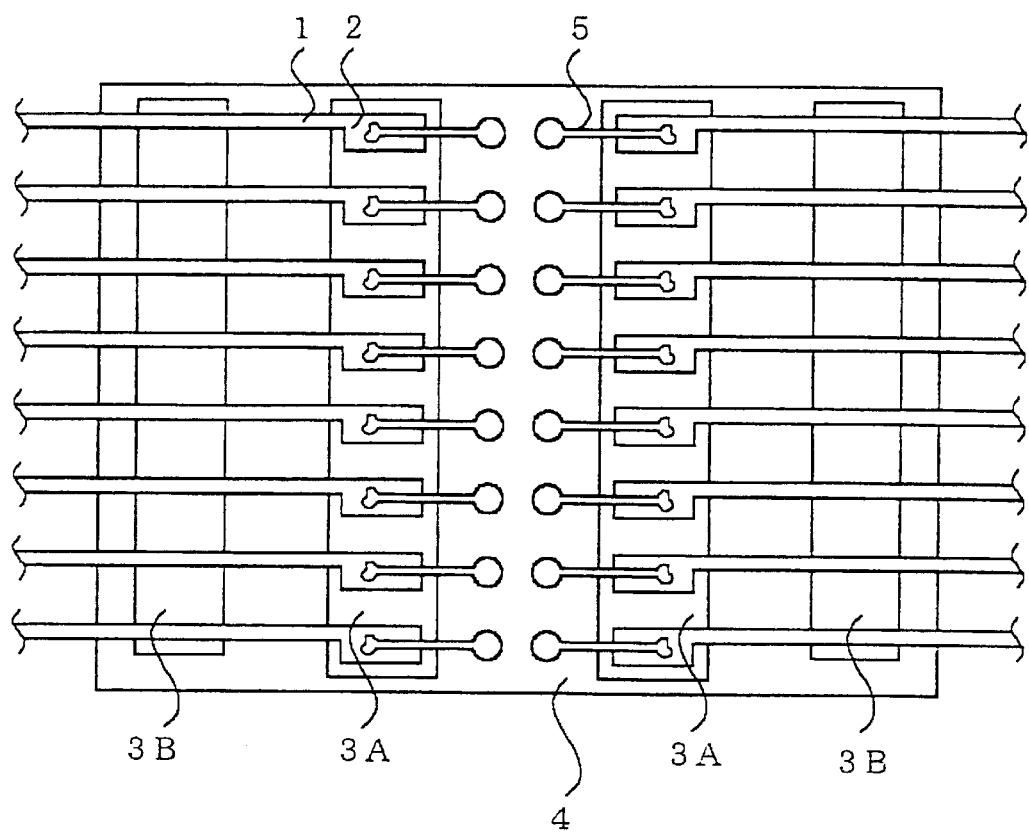
FIG. 6 is a fragmentary plane view illustrative of a novel lead-on-chip structure of a semiconductor device in a first embodiment in accordance with the present invention.
Figure 7:
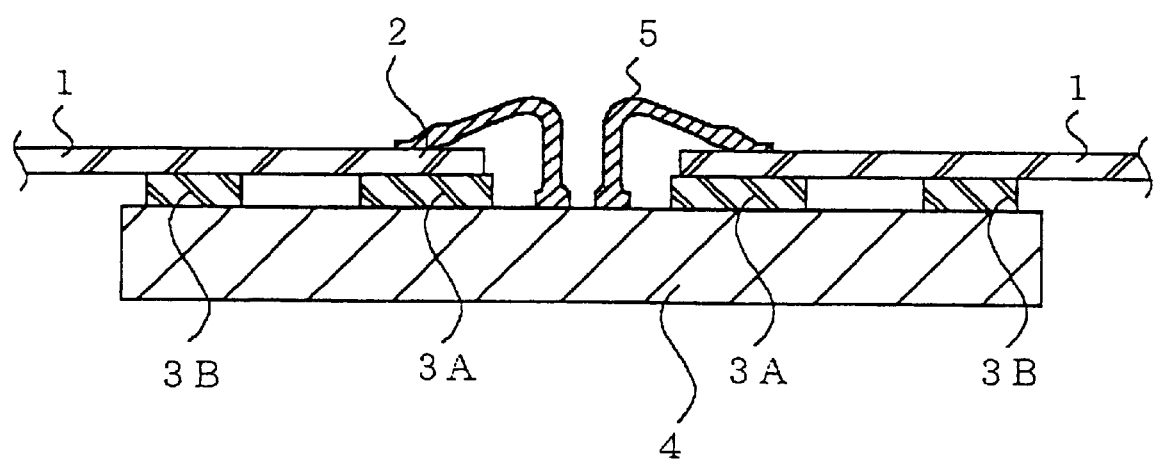
FIG. 7 is a fragmentary cross sectional elevation view illustrative of a novel lead-on-chip structure of a semiconductor device in a first embodiment in accordance with the present invention.
Figure 8:
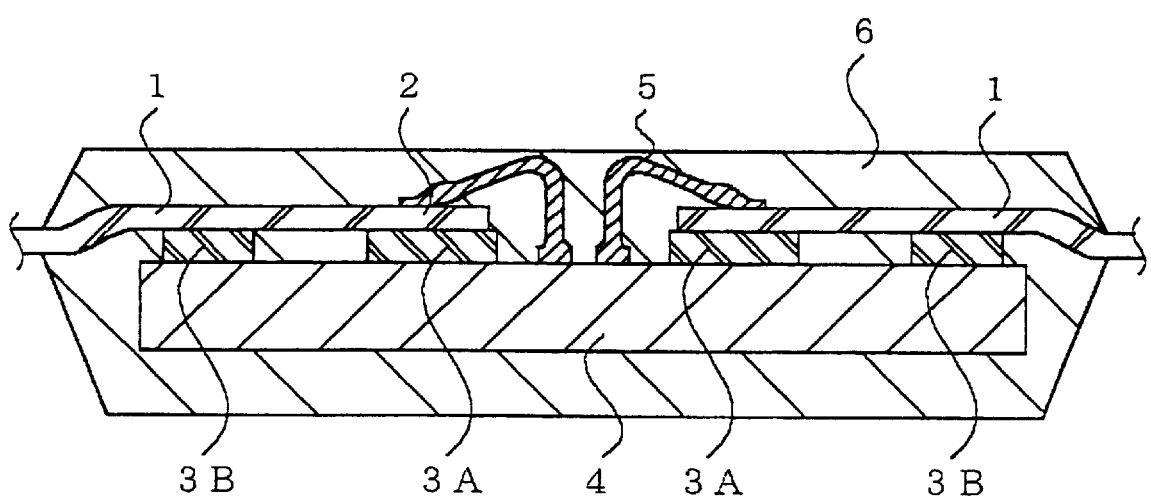
FIG. 8 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention.
Figure 9:
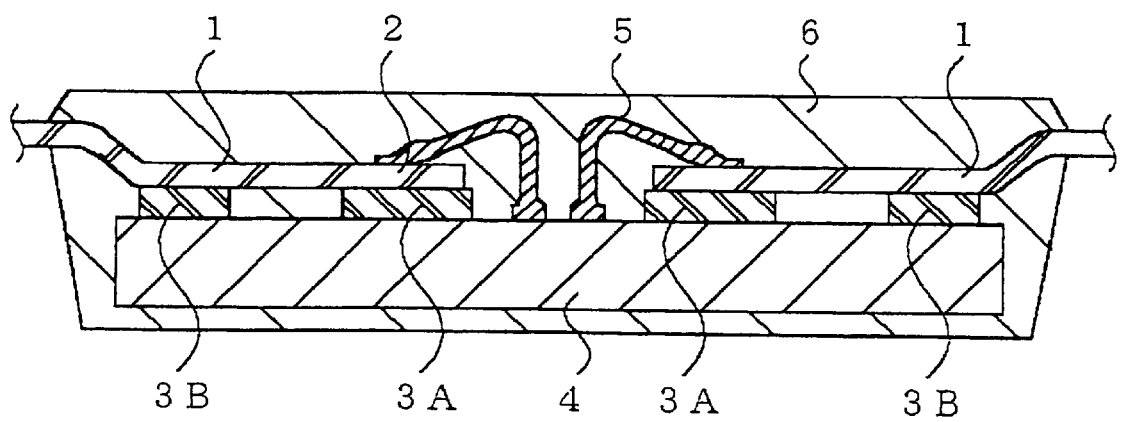
FIG. 9 is a fragmentary cross sectional elevation view illustrative of a novel lead-on-chip structure semiconductor device packaged with a sealing resin wherein a semiconductor chip had received down-force by a molten resin when the resin was injected into dies in a first embodiment in accordance with the present invention.
Figure 10:
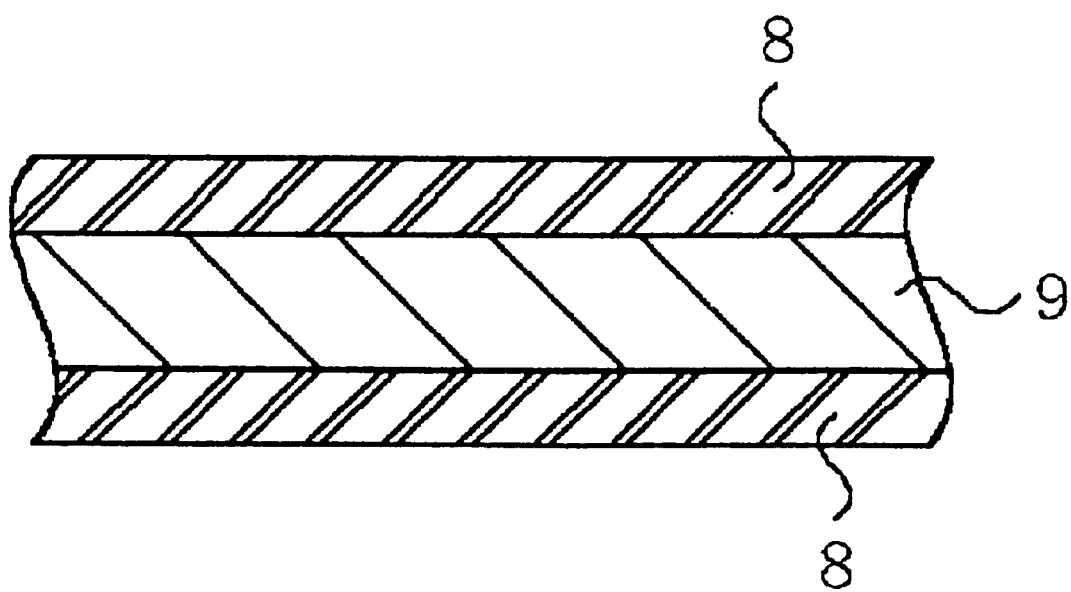
FIG. 10 is a fragmentary cross sectional elevation view illustrative of an electrically insulative adhesive tape to be used for adhering a semiconductor chip to inner leads in accordance with the present invention.

A first embodiment according to the present invention will be described in detail with reference to FIGS. 6, 7, 8, 9 and 10, wherein a novel lead-on-chip structure of a semiconductor is provided. FIG. 6 is a fragmentary plane view illustrative of a novel lead-on-chip structure of a semiconductor device. FIG. 7 is a fragmentary cross sectional elevation view illustrative of a novel lead-on-chip structure of a semiconductor device. FIG. 8 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention. FIG. 9 is a fragmentary cross sectional elevation view illustrative of a novel lead-on-chip structure semiconductor device packaged with a sealing resin wherein a semiconductor chip had received down-force by a molten resin when the resin was injected into dies. FIG. 10 is a fragmentary cross sectional elevation view illustrative of an electrically insulative adhesive tape to be used for adhering a semiconductor chip to inner leads.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are further provided which extend on outer stripe regions in the vicinity of and in parallel to opposite edges of the semiconductor chip 4, where the outer stripe regions are separated from the inner stripe regions. An outside edge of each of the first and second side electrically insulative adhesive outer tapes 3B is positioned slightly inside of the edge of the semiconductor chip 4, so that the inner leads 1 are fixed not only in the stitched portions 2 but also outer positions in the vicinity of the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Second Embodiment

Figure 11:
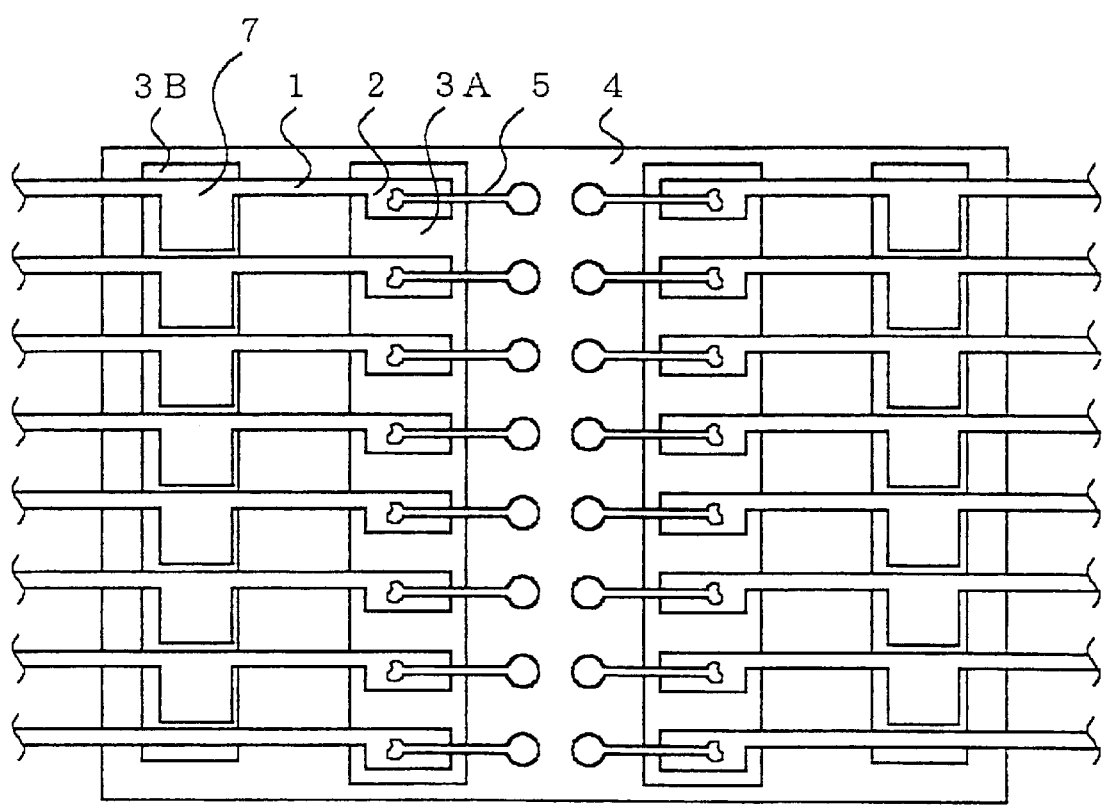
FIG. 11 is a fragmentary plane view illustrative of a novel lead-on-chip structure of a semiconductor device in a second embodiment in accordance with the present invention.

A second embodiment according to the present invention will be described in detail with reference to FIG. 11, wherein a novel lead-on-chip structure of a semiconductor is provided. FIG. 11 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are further provided which extend on outer stripe regions in the vicinity of and in parallel to opposite edges of the semiconductor chip 4, where the outer stripe regions are separated from the inner stripe regions. An outside edge of each of the first and second side electrically insulative adhesive outer tapes 3B is positioned slightly inside of the edge of the semiconductor chip 4, so that the inner leads 1 are fixed not only in the stitched portions 2 but also outer positions in the vicinity of the edge of the semiconductor chip 4.

Each of the electrically insulative adhesive outer tapes 3B has top and bottom surfaces with adhesion force. For example, it may be possible as illustrated in FIG. 10, that the electrically insulative adhesive outer tape 3B may comprise a sandwich multi-layer structure of a base material layer 9 which has a high flexibility sandwiched between adhesive layers 8. Alternatively, a single layered structure is also available provided that the tape has a sufficient adhesive force.

Further, the inner leads 1 have spread portions 7 which are adhered with the electrically insulative adhesive outer tape 3B. The spread portions 7 of the adjacent two of the inner leads 1 are separated from each other, so as to increase an adhering area between the inner leads 1 and the electrically insulative adhesive outer tape 3B and decrease a contact area between the electrically insulative adhesive outer tape 3b with the sealing resin material 6 for packaging the semiconductor chip 4. If an adhesion force of the electrically insulative adhesive tapes 3A and 3B with the sealing resin 6 is relatively weak, it is particularly effective to reduce the contact area between the electrically insulative adhesive tapes 3A and 3B and the sealing resin 6 for obtaining a high fixing force between the semiconductor chip 4 and the sealing resin 6.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Third Embodiment

Figure 12:
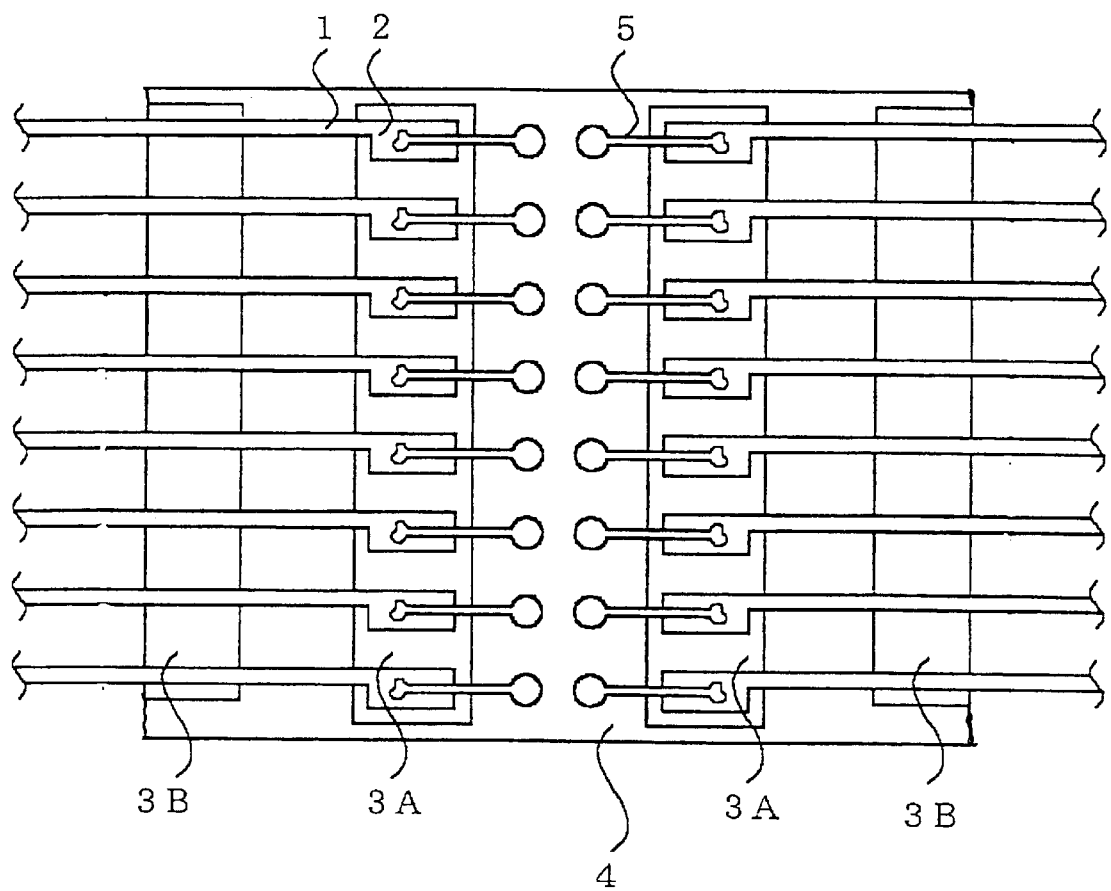
FIG. 12 is a fragmentary plane view illustrative of a novel lead-on-chip structure of a semiconductor device in a third embodiment in accordance with the present invention.
Figure 13:
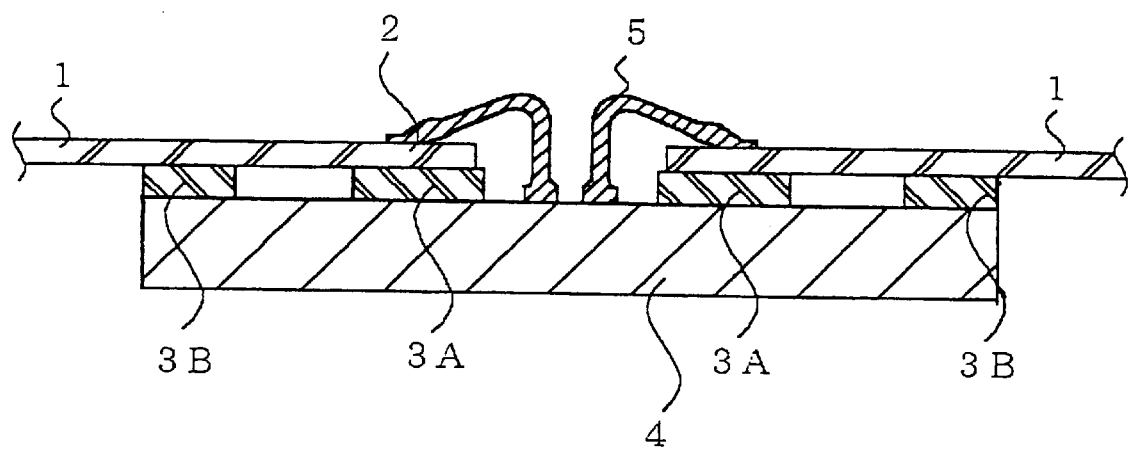
FIG. 13 is a fragmentary cross sectional elevation view illustrative of a novel lead-on-chip structure of a semiconductor device in a third embodiment in accordance with the present invention.
Figure 14:
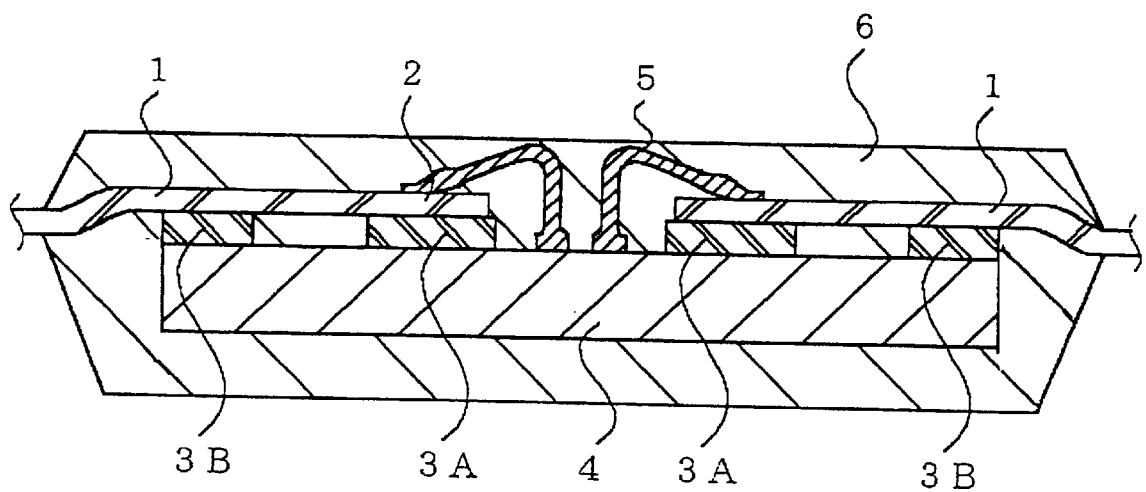
FIG. 14 is a fragmentary cross sectional elevation view illustrative of a novel lead-on-chip structure semiconductor device packaged with a sealing resin wherein a semiconductor chip had received up-force by a molten resin when the resin was injected into dies in a third embodiment in accordance with the present invention.
Figure 15:
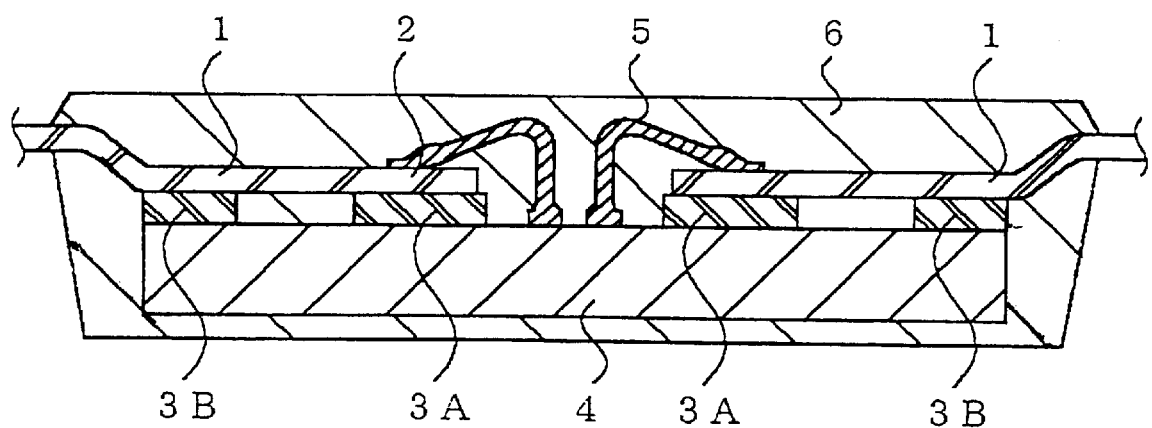
FIG. 15 is a fragmentary cross sectional elevation view illustrative of a novel lead-on-chip structure semiconductor device packaged with a sealing resin wherein a semiconductor chip had received down-force by a molten resin when the resin was injected into dies in a third embodiment in accordance with the present invention.

A third embodiment according to the present invention will be described in detail with reference to FIGS. 12, 13, 14, 15 and 10, wherein a novel lead-on-chip structure of a semiconductor is provided. FIG. 12 is a fragmentary plane view illustrative of a novel lead-on-chip structure of a semiconductor device. FIG. 13 is a fragmentary cross sectional elevation view illustrative of a novel lead-on-chip structure of a semiconductor device. FIG. 14 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention. FIG. 15 is a fragmentary cross sectional elevation view illustrative of a novel lead-on-chip structure semiconductor device packaged with a sealing resin wherein a semiconductor chip had received down-force by a molten resin when the resin was injected into dies. FIG. 10 is a fragmentary cross sectional elevation view illustrative of an electrically insulative adhesive tape to be used for adhering a semiconductor chip to inner leads.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are further provided which extend on outer stripe regions in the vicinity of and in parallel to opposite edges of the semiconductor chip 4, where the outer stripe regions are separated from the inner stripe regions. An outside edge of each of the first and second side electrically insulative adhesive outer tapes 3B is positioned in correspondence to the edge of the semiconductor chip 4, so that the inner leads 1 are fixed not only in the stitched portions 2 but also outer positions at the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that inner leads 1 are fixed not only at the stitched portions 2 but also outside portions at the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Fourth Embodiment

Figure 16:
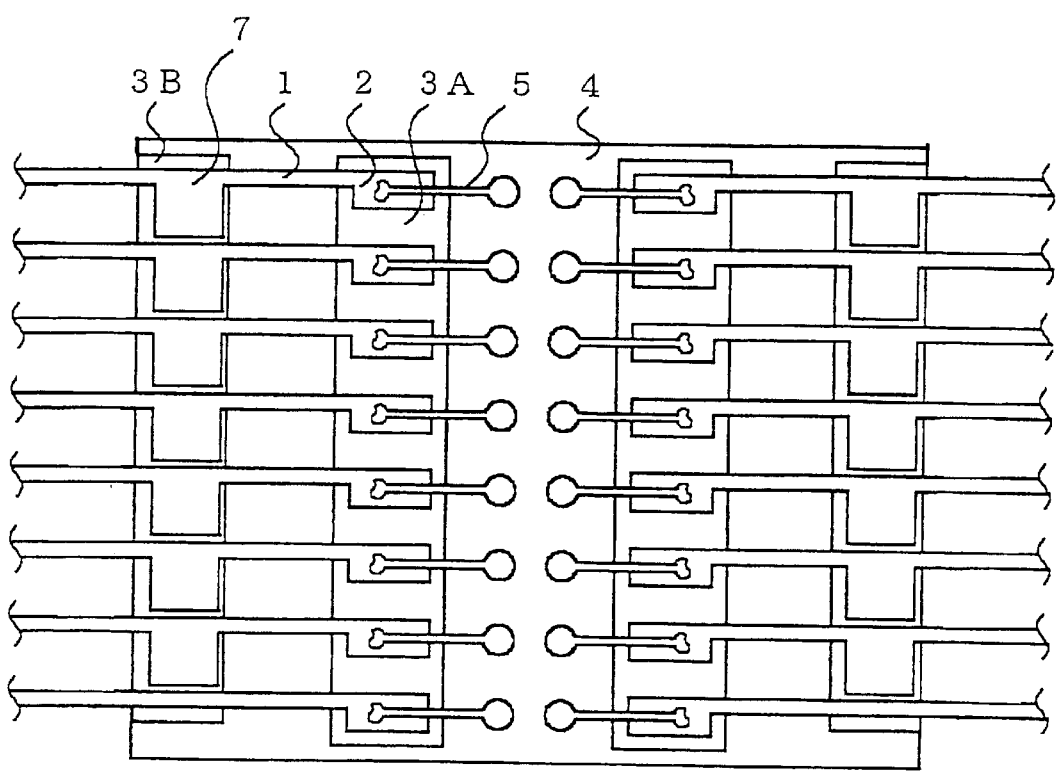
FIG. 16 is a fragmentary plane view illustrative of a novel lead-on-chip structure of a semiconductor device in a fourth embodiment in accordance with the present invention.

A fourth embodiment according to the present invention will be described in detail with reference to FIG. 16, wherein a novel lead-on-chip structure of a semiconductor is provided. FIG. 16 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are further provided which extend on outer stripe regions in the vicinity of and in parallel to opposite edges of the semiconductor chip 4, where the outer stripe regions are separated from the inner stripe regions. An outside edge of each of the first and second side electrically insulative adhesive outer tapes 3B is positioned at the edge of the semiconductor chip 4, so that the inner leads 1 are fixed not only in the stitched portions 2 but also outer positions at the edge of the semiconductor chip 4.

Each of the electrically insulative adhesive outer tapes 3B has top and bottom surfaces with adhesion force. For example, it may be possible as illustrated in FIG. 10, that the electrically insulative adhesive outer tape 3B may comprise a sandwich multi-layer structure of a base material layer 9 which has a high flexibility sandwiched between adhesive layers 8. Alternatively, a single layered structure is also available provided that the tape has a sufficient adhesive force.

Further, the inner leads 1 have spread portions 7 which are adhered with the electrically insulative adhesive outer tape 3B. The spread portions 7 of the adjacent two of the inner leads 1 are separated from each other, so as to increase an adhering area between the inner leads 1 and the electrically insulative adhesive outer tape 3B and decrease a contact area between the electrically insulative adhesive outer tape 3b with the sealing resin material 6 for packaging the semiconductor chip 4. If an adhesion force of the electrically insulative adhesive tapes 3A and 3B with the sealing resin 6 is relatively weak, it is particularly effective to reduce the contact area between the electrically insulative adhesive tapes 3A and 3B and the sealing resin 6 for obtaining a high fixing force between the semiconductor chip 4 and the sealing resin 6.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that inner leads 1 are fixed not only at the stitched portions 2 but also outside portions at the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Fifth Embodiment

Figure 17:
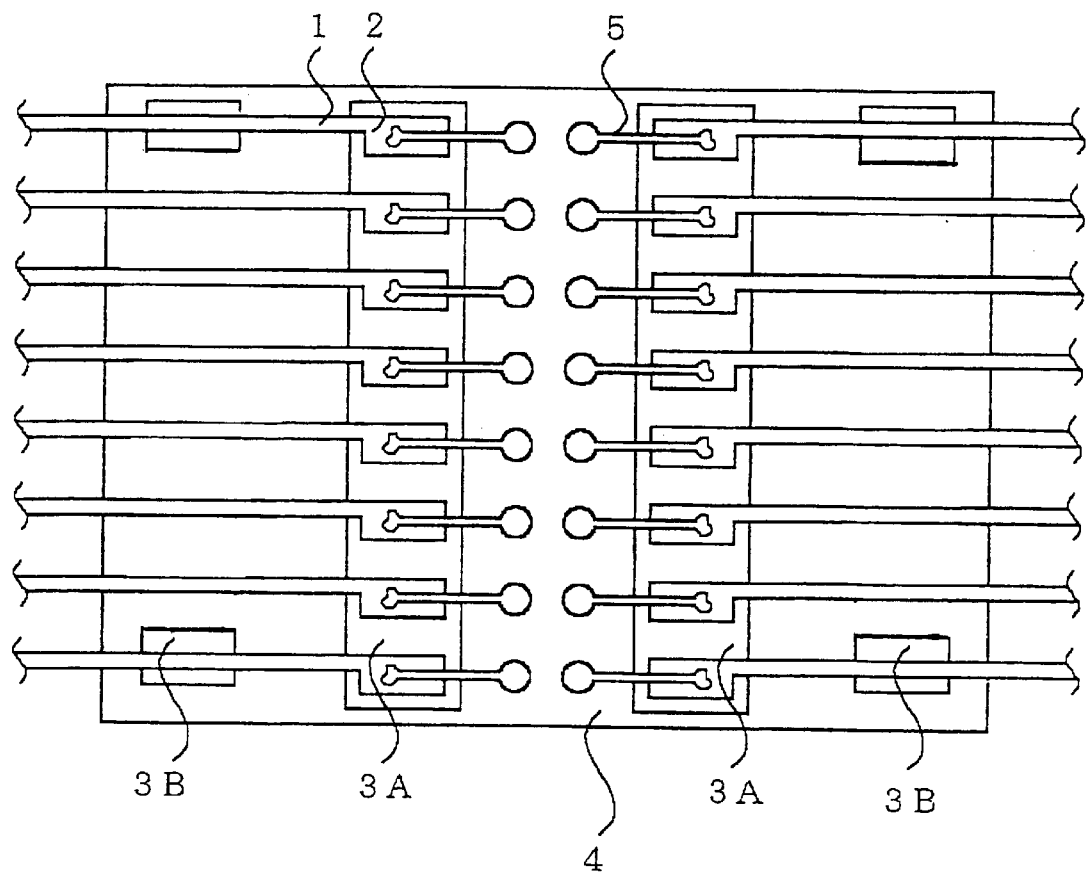
FIG. 17 is a fragmentary plane view illustrative of a novel lead-on-chip structure of a semiconductor device in a fifth embodiment in accordance with the present invention.
Figure 18:
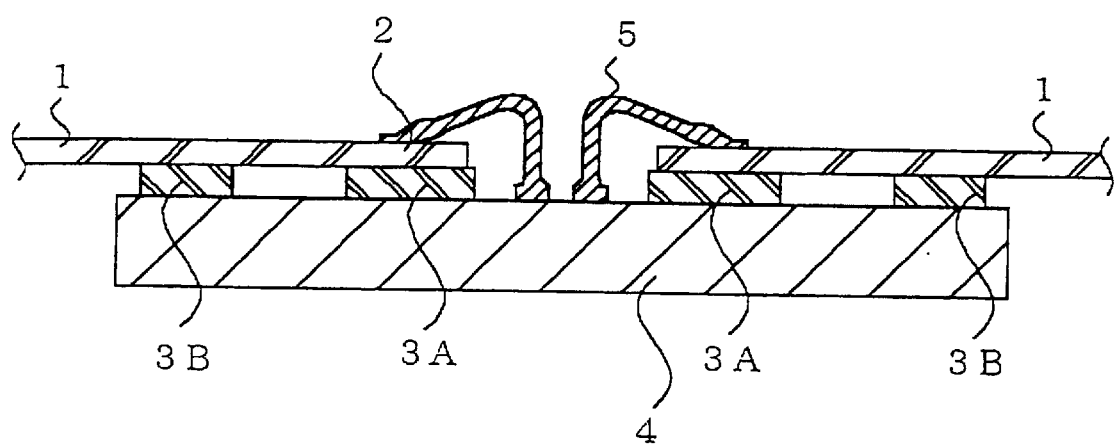
FIG. 18 is a fragmentary cross sectional elevation view illustrative of a novel lead-on-chip structure of a semiconductor device in a fifth embodiment in accordance with the present invention.
Figure 19:
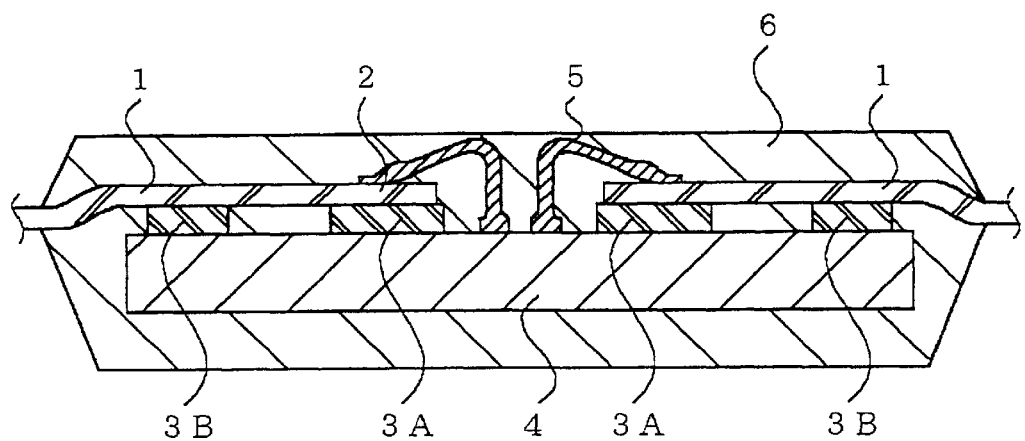
FIG. 19 is a fragmentary cross sectional elevation view illustrative of a novel lead-on-chip structure semiconductor device packaged with a sealing resin wherein a semiconductor chip had received up-force by a molten resin when the resin was injected into dies in a fifth embodiment in accordance with the present invention.
Figure 20:
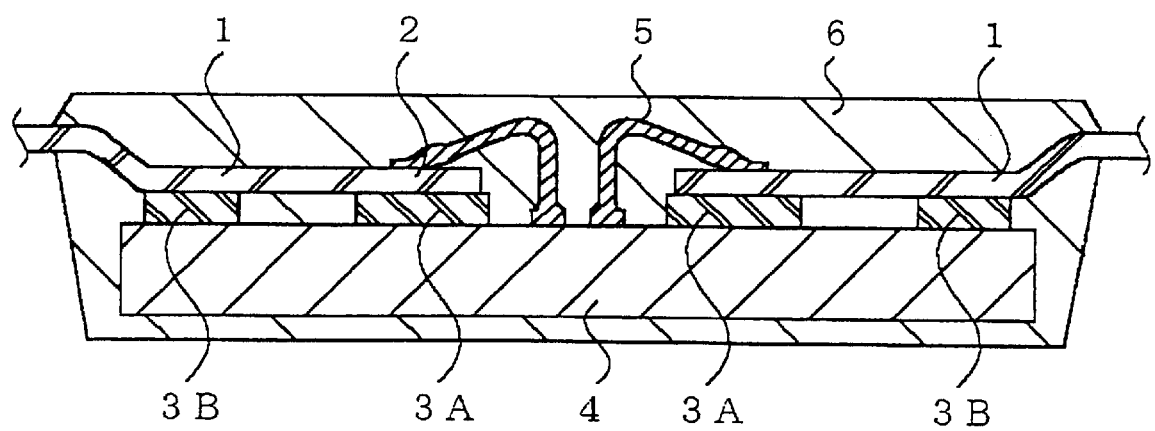
FIG. 20 is a fragmentary cross sectional elevation view illustrative of a novel lead-on-chip structure semiconductor device packaged with a sealing resin wherein a semiconductor chip had received down-force by a molten resin when the resin was injected into dies in a fifth embodiment in accordance with the present invention.

A fifth embodiment according to the present invention will be described in detail with reference to FIGS. 17, 18, 19, 20 and 10, wherein a novel lead-on-chip structure of a semiconductor is provided. FIG. 17 is a fragmentary plane view illustrative of a novel lead-on-chip structure of a semiconductor device. FIG. 18 is a fragmentary cross sectional elevation view illustrative of a novel lead-on-chip structure of a semiconductor device. FIG. 19 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention. FIG. 20 is a fragmentary cross sectional elevation view illustrative of a novel lead-on-chip structure semiconductor device packaged with a sealing resin wherein a semiconductor chip had received down-force by a molten resin when the resin was injected into dies.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only outermost two of the inner leads 1 in the vicinity of the edges of the semiconductor chip 4. An outside edge of each of the first and second side electrically insulative adhesive outer tapes 3B is positioned slightly inside of the edge of the semiconductor chip 4, so that the outermost two of the inner leads 1 are fixed not only in the stitched portions 2 but also outer positions in the vicinity of the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that the outer-most two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Sixth Embodiment

Figure 21:
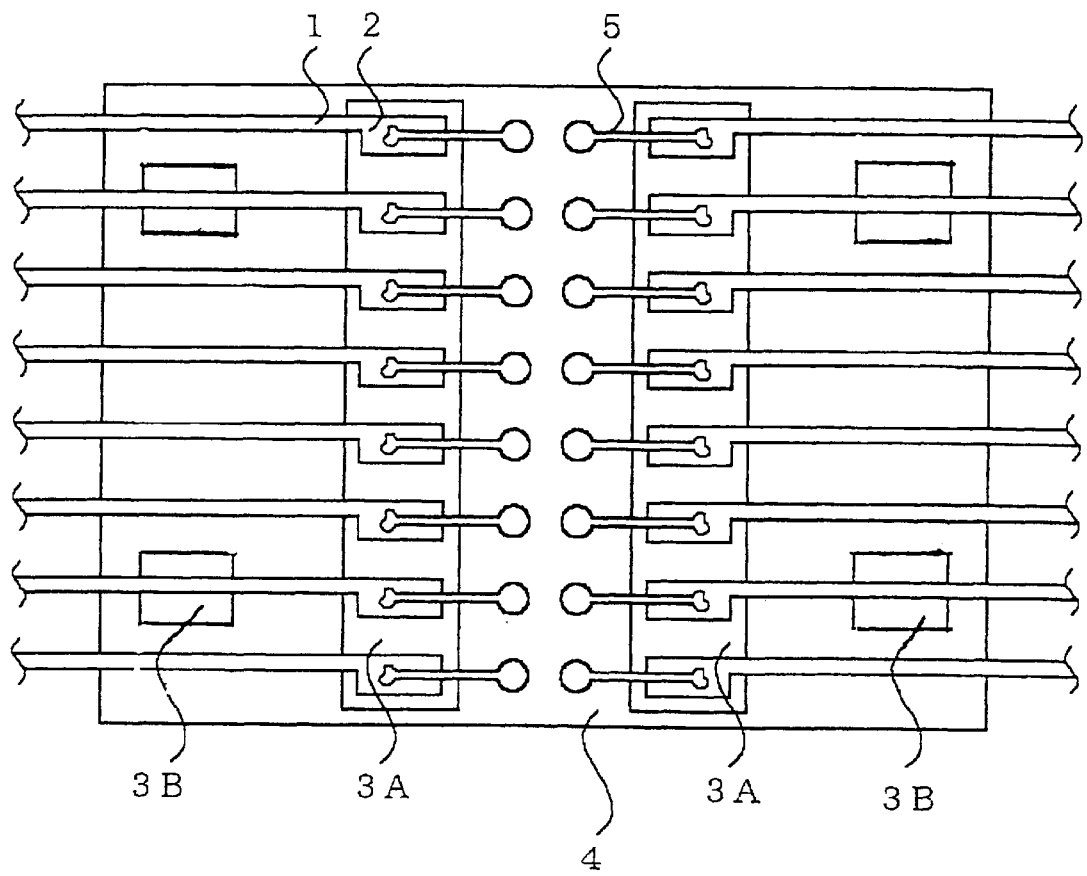
FIG. 21 is a fragmentary plane view illustrative of a novel lead-on-chip structure of a semiconductor device in a sixth embodiment in accordance with the present invention.

A sixth embodiment according to the present invention will be described in detail with reference to FIGS. 21 and 10, wherein a novel lead-on-chip structure of a semiconductor is provided. FIG. 21 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only second outer two of the inner leads 1 in the vicinity of the edges of the semiconductor chip 4. An outside edge of each of the first and second side electrically insulative adhesive outer tapes 3B is positioned slightly inside of the edge of the semiconductor chip 4, so that the second outer two of the inner leads 1 are fixed not only in the stitched portions 2 but also outer positions in the vicinity of the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that the second outer two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Seventh Embodiment

Figure 22:
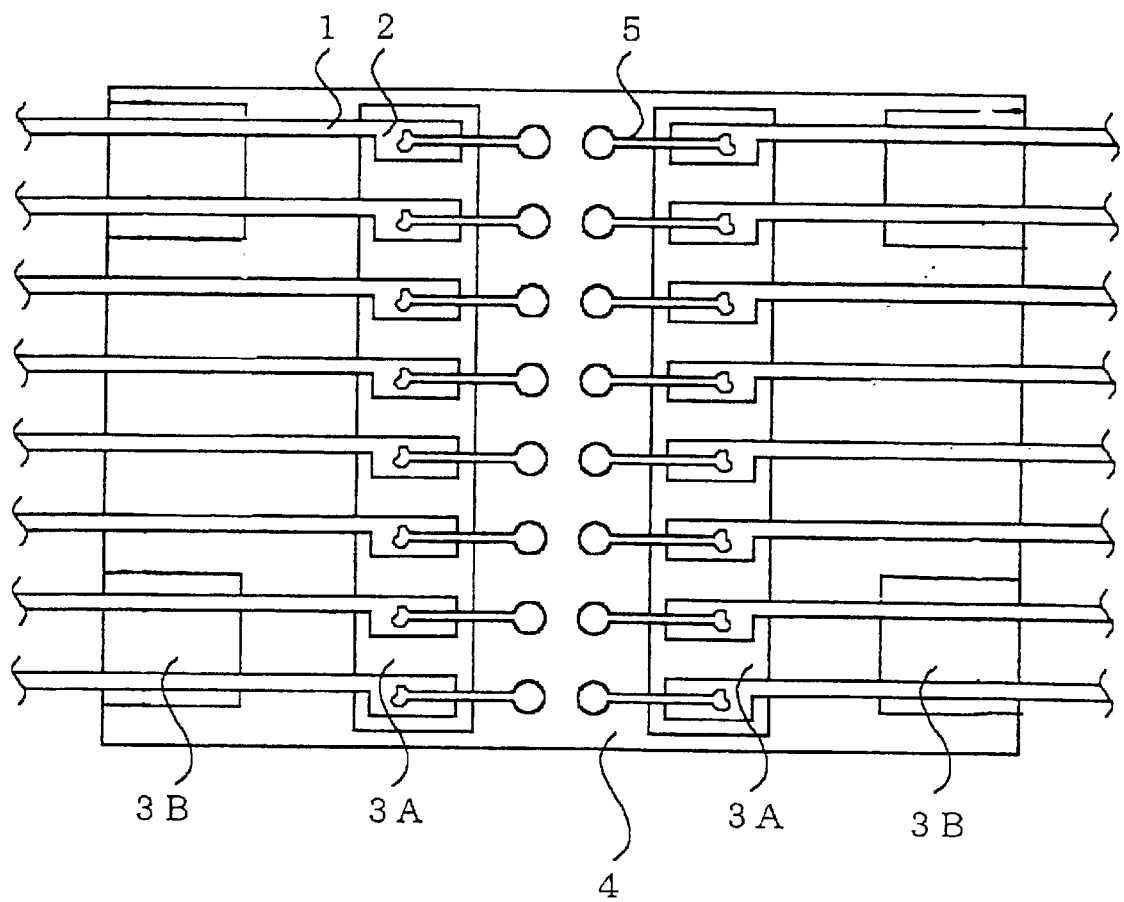
FIG. 22 is a fragmentary plane view illustrative of a novel lead-on-chip structure of a semiconductor device in a seventh embodiment in accordance with the present invention.
Figure 23:
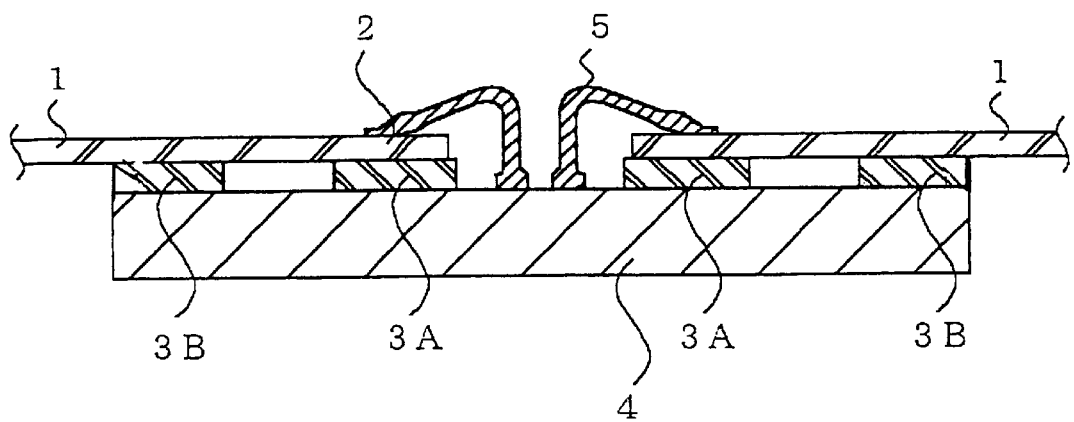
FIG. 23 is a fragmentary cross sectional elevation view illustrative of a novel lead-on-chip structure of a semiconductor device in a seventh embodiment in accordance with the present invention.
Figure 24:
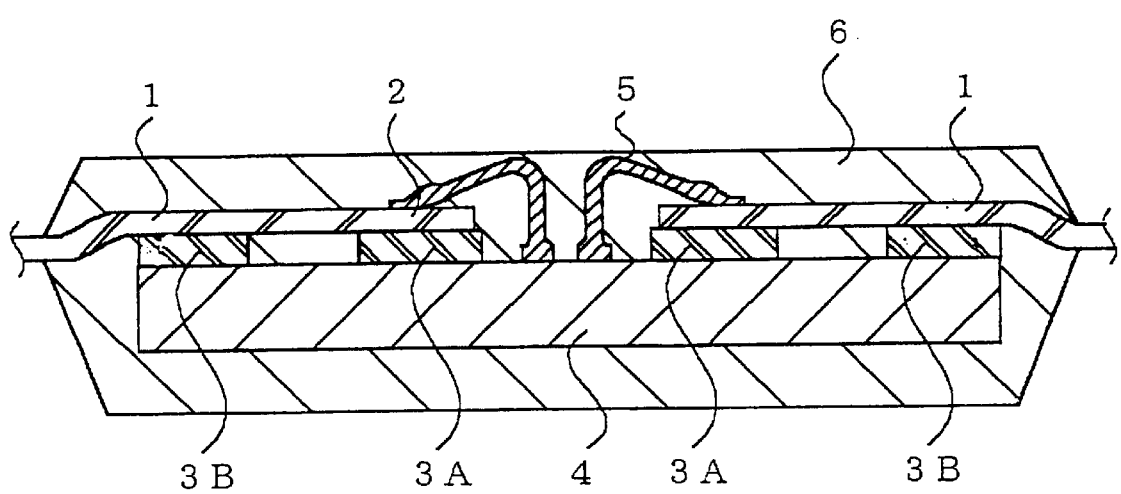
FIG. 24 is a fragmentary cross sectional elevation view illustrative of a novel lead-on-chip structure semiconductor device packaged with a sealing resin wherein a semiconductor chip had received up-force by a molten resin when the resin was injected into dies in a seventh embodiment in accordance with the present invention.
Figure 25:
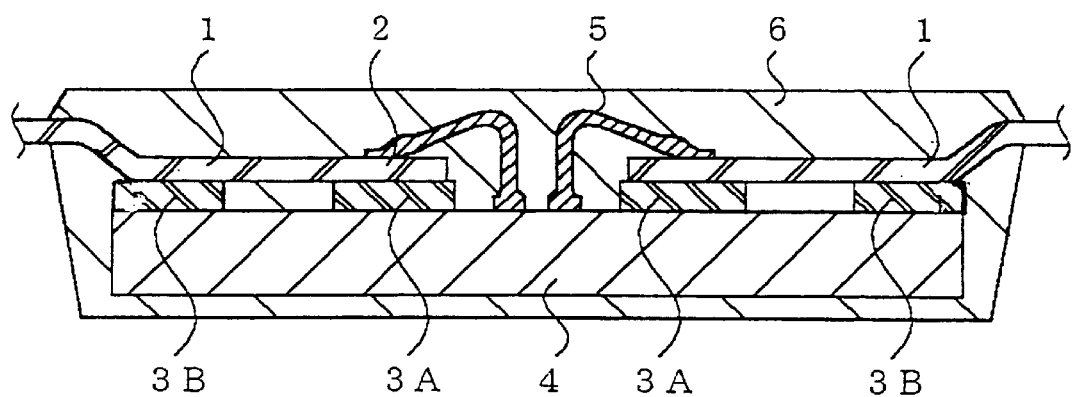
FIG. 25 is a fragmentary cross sectional elevation view illustrative of a novel lead-on-chip structure semiconductor device packaged with a sealing resin wherein a semiconductor chip had received down-force by a molten resin when the resin was injected into dies in a seventh embodiment in accordance with the present invention.

A seventh embodiment according to the present invention will be described in detail with reference to FIGS. 22, 23, 24, 25 and 10, wherein a novel lead-on-chip structure of a semiconductor is provided. FIG. 22 is a fragmentary plane view illustrative of a novel lead-on-chip structure of a semiconductor device. FIG. 23 is a fragmentary cross sectional elevation view illustrative of a novel lead-on-chip structure of a semiconductor device. FIG. 24 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention. FIG. 25 is a fragmentary cross sectional elevation view illustrative of a novel lead-on-chip structure semiconductor device packaged with a sealing resin wherein a semiconductor chip had received down-force by a molten resin when the resin was injected into dies.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only outer-most two and second outer two of the inner leads 1 in the vicinity of the edges of the semiconductor chip 4. An outside edge of each of the first and second side electrically insulative adhesive outer tapes 3B is positioned slightly inside of the edge of the semiconductor chip 4, so that the outer-most two and second outer two of the inner leads 1 are fixed not only in the stitched portions 2 but also outer positions in the vicinity of the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that the outer-most two and second outer two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Eighth Embodiment

Figure 26:
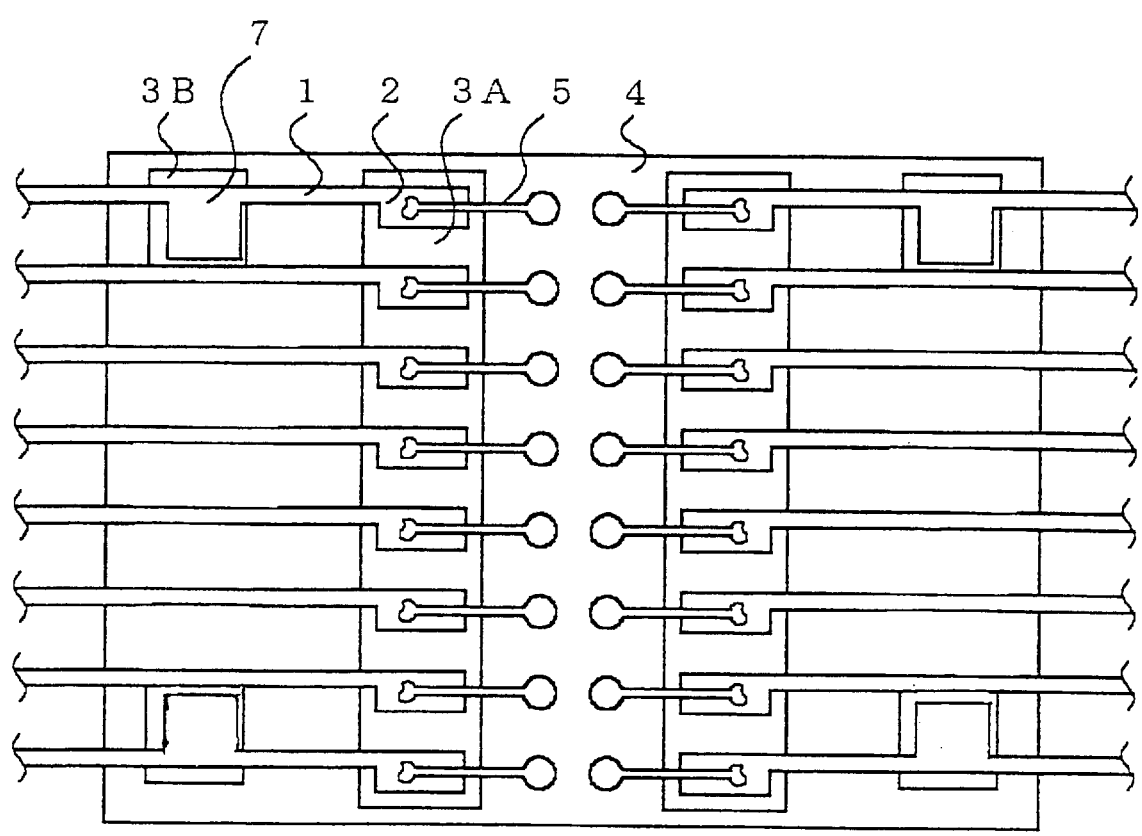
FIG. 26 is a fragmentary plane view illustrative of a novel lead-on-chip structure of a semiconductor device in an eighth embodiment in accordance with the present invention.
Figure 27:
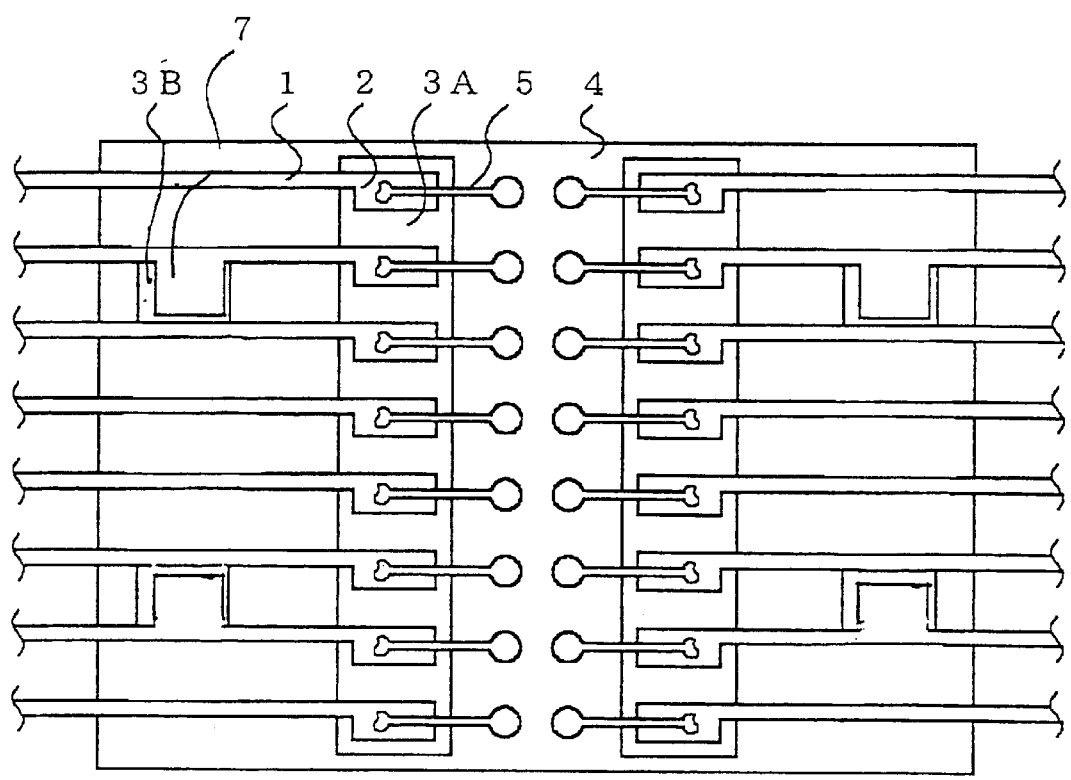
FIG. 27 is a fragmentary plane view illustrative of a novel lead-on-chip structure of a semiconductor device in a ninth embodiment in accordance with the present invention.

An eighth embodiment according to the present invention will be described in detail with reference to FIGS. 26 and 10, wherein a novel lead-on-chip structure of a semiconductor is provided. FIG. 26 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads., The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only outer-most two of the inner leads 1 in the vicinity of the edges of the semiconductor chip 4. An outside edge of each of the first and second side electrically insulative adhesive outer tapes 3B is positioned slightly inside of the edge of the semiconductor chip 4, so that the outer-most two of the inner leads 1 are fixed not only in the stitched portions 2 but also outer positions in the vicinity of the edge of the semiconductor chip 4.

Further, the outer-most two of the inner leads 1 have spread portions 7 which are adhered with the electrically insulative adhesive outer tapes 3B, so as to increase an adhering area between the inner leads 1 and the electrically insulative adhesive outer tapes 3B and decrease a contact area between the electrically insulative adhesive outer tapes 3b with the sealing resin material 6 for packaging the semiconductor chip 4. If an adhesion force of the electrically insulative adhesive tapes 3A and 3B with the sealing resin 6 is relatively weak, it is particularly effective to reduce the contact area between the electrically insulative adhesive tapes 3A and 3B and the sealing resin 6 for obtaining a high fixing force between the semiconductor chip 4 and the sealing resin 6.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically, insulative adhesive outer tapes 3B would result in that the outer-most two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Ninth Embodiment

A ninth embodiment according to the present invention will be described in detail with reference to FIG. 21 and 10, wherein a novel lead-on-chip structure of a semiconductor is provided. FIG. 21 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads, 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only second outer two of the inner leads 1 in the vicinity of the edges of the semiconductor chip 4. An outside edge of each of the first and second side electrically insulative adhesive cuter tapes 3B is positioned slightly inside of the edge of the semiconductor chip 4, so that the second outer two of the inner leads 1 are fixed not only in the stitched portions 2 but also outer positions in the vicinity of the edge of the semiconductor chip 4.

Further, the second outer two of the inner leads 1 have spread portions 7 which are adhered with the electrically insulative adhesive outer tapes 3B, so as to increase an adhering area between the inner leads 1 and the electrically insulative adhesive outer tapes 3B and decrease a contact area between the electrically insulative adhesive outer tapes 3b with the sealing resin material 6 for packaging the semiconductor chip 4. If an adhesion force of the electrically insulative adhesive tapes 3A and 3B with the sealing resin 6 is relatively weak, it is particularly effective to reduce the contact area between the electrically insulative adhesive tapes 3A and 3B and the sealing resin 6 for obtaining a high fixing force between the semiconductor chip 4 and the sealing resin 6.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that the second outer two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Tenth Embodiment

Figure 28:
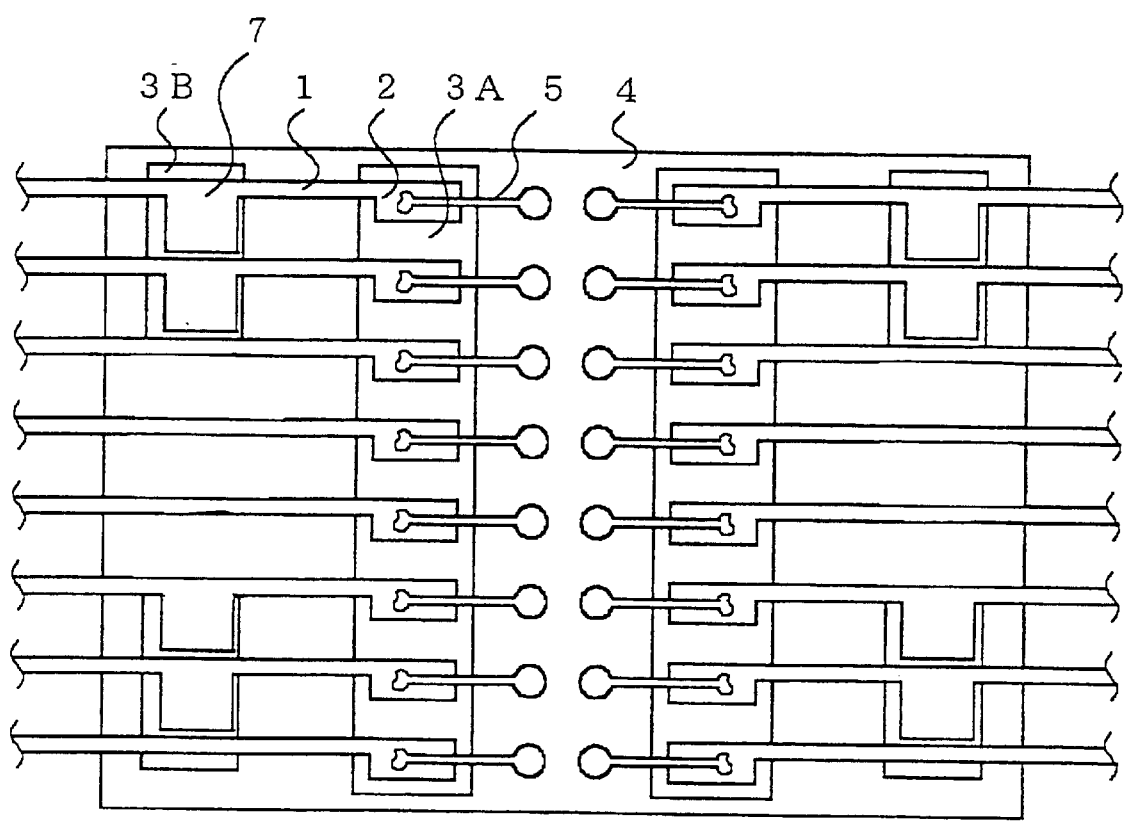
FIG. 28 is a fragmentary plane view illustrative of a novel lead-on-chip structure of a semiconductor device in a tenth embodiment in accordance with the present invention.

A tenth embodiment according to the present invention will be described in detail with reference to FIGS. 28 and 10, wherein a novel lead-on-chip structure of a semiconductor is provided. FIG. 28 is a fragmentary plane view illustrative of a novel lead-on-chip structure of a semiconductor device.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive inner tapes 3A are adhered onto first and second inner stripe regions of the semiconductor chip 4 in the process for adhering the semiconductor chip onto the inner leads 1 of a lead frame. The first and second inner stripe regions are positioned outside of the bonding pads. The top surfaces of the first and second side electrically insulative adhesive inner tapes 3A have previously been adhered on bottom surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are selectively provided which reside in the vicinity of four corners of the semiconductor chip 4 to adhere only outer-most two and second outer two of the inner leads 1 in the vicinity of the edges of the semiconductor chip 4. An outside edge of each of the first and second side electrically insulative adhesive outer tapes 3B is positioned slightly inside of the edge of the semiconductor chip 4, so that the outer-most two and second outer two of the inner leads 1 are fixed not only in the stitched portions 2 but also outer positions in the vicinity of the edge of the semiconductor chip 4.

Further, the outer-most two and the second outer two of the inner leads 1 have spread portions 7 which are adhered with the electrically insulative adhesive outer tapes 3B, so as to increase an adhering area between the inner leads 1 and the electrically insulative adhesive outer tapes 3B and decrease a contact area between the electrically insulative adhesive outer tapes 3b with the sealing resin material 6 for packaging the semiconductor chip 4. If an adhesion force of the electrically insulative adhesive tapes 3A and 3B with the sealing resin 6 is relatively weak, it is particularly effective to reduce the contact area between the electrically insulative adhesive tapes 3A and 3B and the sealing resin 6 for obtaining a high fixing force between the semiconductor chip 4 and the sealing resin 6.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that the outer-most two and second outer two of the inner leads 1 are fixed not only at the stitched portions 2 but also outside portions in the vicinity of the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Eleventh Embodiment

Figure 29:
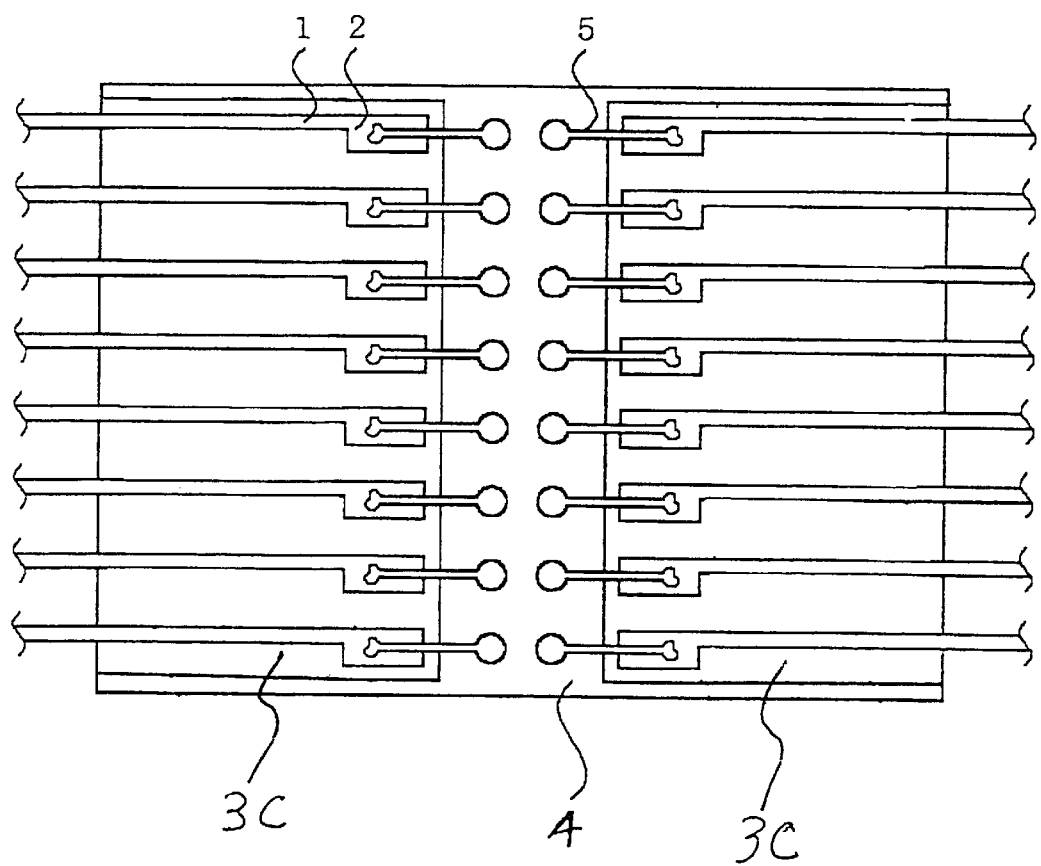
FIG. 29 is a fragmentary plane view illustrative of a novel lead-on-chip structure of a semiconductor device in an eleventh embodiment in accordance with the present invention.
Figure 30:
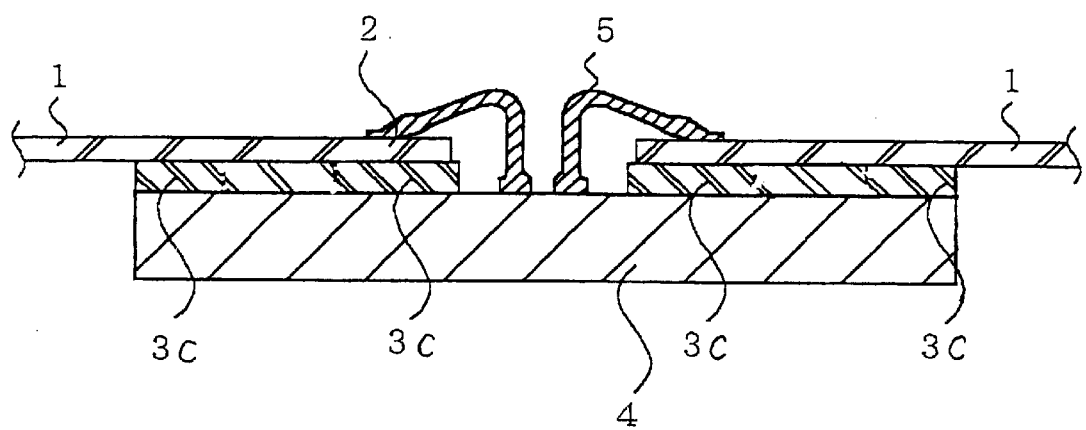
FIG. 30 is a fragmentary cross sectional elevation view illustrative of a novel lead-on-chip structure of a semiconductor device in an eleventh embodiment in accordance with the present invention.
Figure 31:
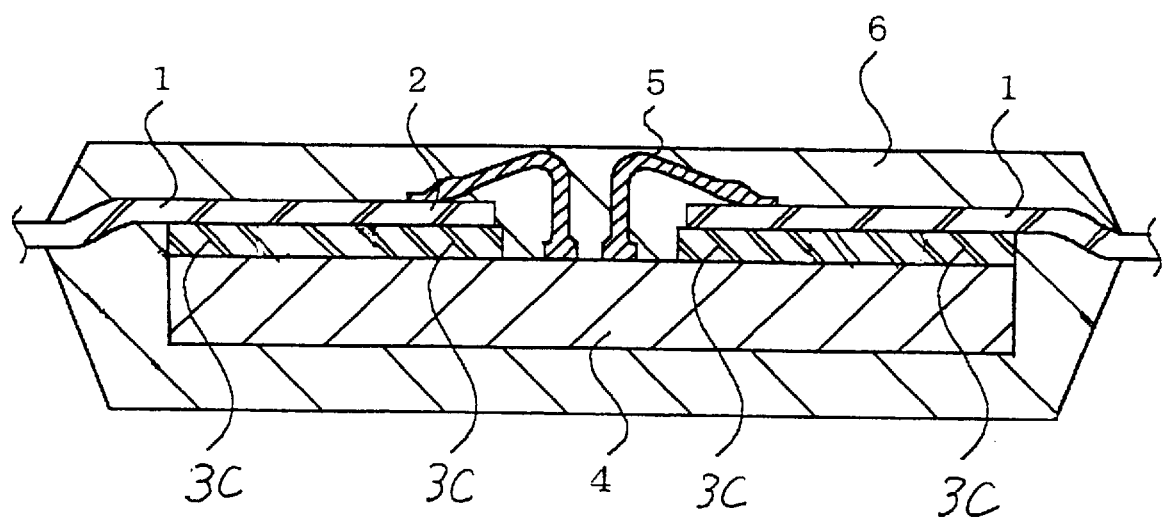
FIG. 31 is a fragmentary cross sectional elevation view illustrative of a novel lead-on-chip structure semiconductor device packaged with a sealing resin wherein a semiconductor chip had received up-force by a molten resin when the resin was injected into dies in an eleventh embodiment in accordance with the present invention.
Figure 32:
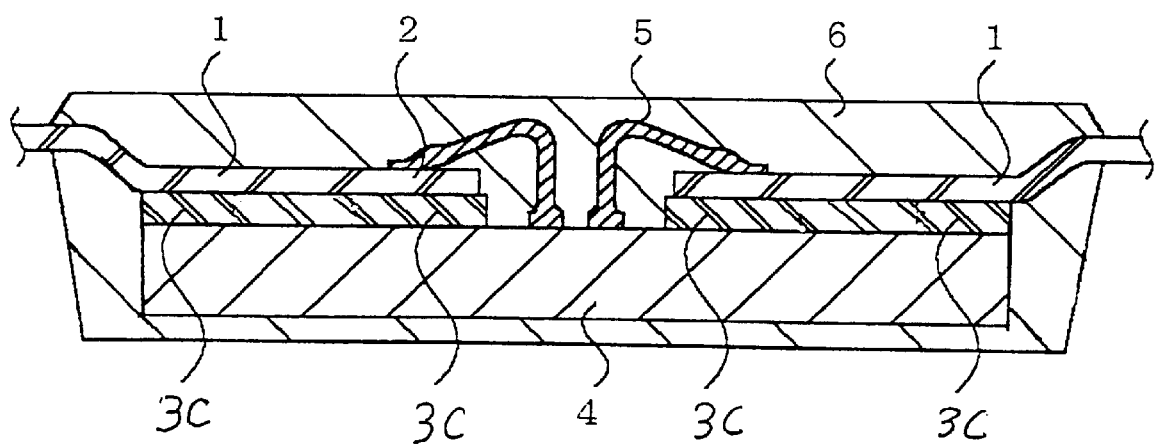
FIG. 32 is a fragmentary cross sectional elevation view illustrative of a novel lead-on-chip structure semiconductor device packaged with a sealing resin wherein a semiconductor chip had received down-force by a molten resin when the resin was injected into dies in an eleventh embodiment in accordance with the present invention.

An eleventh embodiment according to the present invention will be described in detail with reference to FIGS. 29, 30, 31, 32 and 10, wherein a novel lead-on-chip structure of a semiconductor is provided. FIG. 29 is a fragmentary plane view illustrative of a novel lead-on-chip structure of a semiconductor device. FIG. 30 is a fragmentary cross sectional elevation view illustrative of a novel lead-on-chip structure of a semiconductor device. FIG. 31 is a fragmentary cross sectional elevation view illustrative of a novel lead-on-chip structure semiconductor device packaged with a sealing resin wherein a semiconductor chip had received up-force by a molten resin when the resin was injected into dies in a first embodiment in accordance with the present invention. FIG. 32 is a fragmentary cross sectional elevation view illustrative of a novel lead-on-chip structure semiconductor device packaged with a sealing resin wherein a semiconductor chip had received down-force by a molten resin when the resin was injected into dies.

The lead-on-chip structure comprises the following elements. A semiconductor chip 4 has a top surface which further has two alignments of bonding pads along opposite sides of a center line of the semiconductor chip 4. The center line separates the semiconductor chip 4 into first (left) and second (right) side regions. First and second alignments of inner leads 1 extend over the first and second side regions of the semiconductor chip 4 respectively so that the inner leads 1 are spaced from the top surface of the semiconductor chip 4. The inner leads 1 have stitched portions 2 positioned in inside terminal portions thereof. The stitched portions 2 of the inner leads 1 are positioned outside of the bonding pads. The inner leads 1 extend substantially in parallel to each other and along a direction vertical to the center line of the semiconductor chip 4. Bonding wires 5 electrically connect the stitched portions 2 of the inner leads 1 to corresponding ones of the bonding pads of the semiconductor chip 4.

First (left) and second (right) side electrically insulative adhesive tapes 3C are provided for adhering the semiconductor chip 4 to the stitched portions of the inner leads 1. Each of the electrically insulative adhesive tapes 3C has top and bottom surfaces with adhesion force. For example, it may be possible as illustrated in FIG. 10, that the electrically insulative adhesive inner tape 3C may comprise a sandwich multi-layer structure of a base material layer 9 which has a high flexibility sandwiched between adhesive layers 8. Alternatively, a single layered structure is also available provided that the tape has a sufficient adhesive force. The bottom surfaces of the first and second side electrically insulative adhesive tapes 3C are adhered almost entirely onto first and second regions of the semiconductor chip 4 in the process for adhering the semiconductor chip onto the inner leads 1 of a lead frame. The top surfaces of the first and second side electrically insulative adhesive tapes 3B have previously been adhered on bottom surfaces of the inner leads 1 extending over the semiconductor chip 4 before the process for adhering the semiconductor chip 4 onto the inner leads 1 of a lead frame. The first and second side electrically insulative adhesive tapes 3C extend from the inside portions up to opposite edges of the semiconductor chip 4 so that an outside edge of each of the first and second side electrically insulative adhesive tapes 3c is positioned in correspondence to the edge of the semiconductor chip 4, whereby the inner leads 1 are fixed in the entire portions extending over the semiconductor chip 4.

In accordance with the present invention, the semiconductor chip 4 and the inner leads 1 aligned are fixed by the electrically insulative adhesive tapes at entire positions to keep a positional balance of fixing points so as to certainly prevent the any substantive movement of the semiconductor chip 4 particularly in the direction vertical to the surface of the semiconductor chip 4.

Namely, the presence of the electrically insulative adhesive tapes 3C would result in that inner leads 1 are fixed not only at the stitched portions 2 but also any other portions extending over the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the semiconductor chip 4 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Twelfth Embodiment

Figure 33:
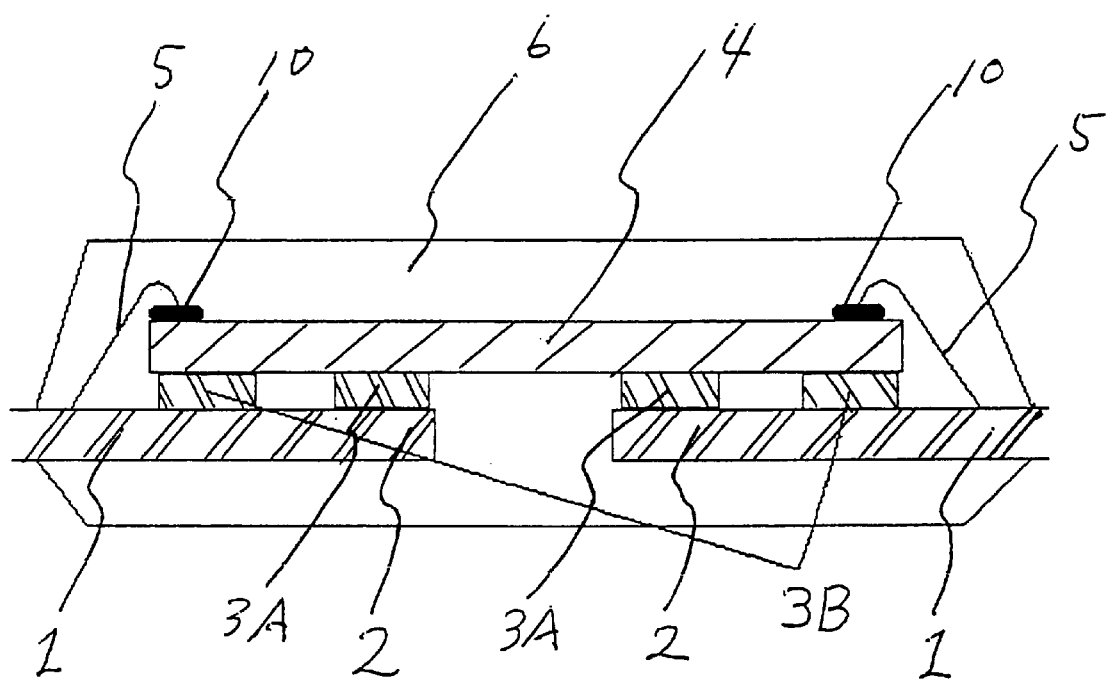
FIG. 33 is a fragmentary cross sectional elevation view illustrative of a novel chip-on-lead structure of a semiconductor device in a twelfth embodiment in accordance with the present invention.

A twelfth embodiment according to the present invention will be described in detail with reference to FIGS. 33 and 10, wherein a novel lead-on-chip structure of a semiconductor is provided. FIG. 33 is a fragmentary plane view illustrative of a novel chip-on-lead structure of a semiconductor device.

The chip-on-lead structure comprises the following elements. A semiconductor chip 4 has a top surface which further has two alignments of bonding pads along opposite side edges of the semiconductor chip 4. A center line separates the semiconductor chip 4 into first (left) and second (right) side regions. First and second alignments of inner leads 1 extend under the first and second side regions of the semiconductor chip 4 respectively so that the inner leads 1 are spaced from the bottom surface of the semiconductor chip 4. The inner leads 1 have stitched portions 2 positioned in inside terminal portions thereof. The inner leads 1 extend substantially in parallel to each other and along a direction vertical to the center line of the semiconductor chip 4. Bonding wires 5 electrically connect the outer portions of the inner leads 1 to corresponding ones of the bonding pads of the semiconductor chip 4.

First (left) and second (right) side electrically insulative adhesive inner tapes 3A are provided for adhering the semiconductor chip 4 to the stitched portions of the inner leads 1. Each of the electrically insulative adhesive inner tapes 3A has top and bottom surfaces with adhesion force. For example, it may be possible as illustrated in FIG. 10, that the electrically insulative adhesive inner tape 3A may comprise a sandwich multi-layer structure of a base material layer 9 which has a high flexibility sandwiched between adhesive layers 8. Alternatively, a single layered structure is also available provided that the tape has a sufficient adhesive force. The top surfaces of the first and second side electrically insulative adhesive inner tapes 3A are adhered onto first and second inner stripe regions of the semiconductor chip 4 in the process for adhering the semiconductor chip onto the inner leads 1 of a lead frame. The bottom surfaces of the first and second side electrically insulative adhesive inner tapes 3A have previously been adhered on top surfaces of the stitched portions 2 of the inner leads 1 before the process for adhering the semiconductor chip onto the inner leads 1 of a lead frame.

For the present invention, it is also important that first and second side electrically insulative adhesive outer tapes 3B are further provided which extend on outer stripe regions in the vicinity of and in parallel to opposite edges of the semiconductor chip 4, where the outer stripe regions are separated from the inner stripe regions. An outside edge of each of the first and second side electrically insulative adhesive outer tapes 3B is positioned in correspondence to the edge of the semiconductor chip 4, so that the inner leads 1 are fixed not only in the stitched portions 2 but also outer positions at the edge of the semiconductor chip 4.

In accordance with the present invention, the semiconductor chip 4 and the inner leads 1 aligned are fixed by the electrically insulative adhesive tapes at a plurality of positions which are distanced from each other to keep a positional balance of fixing points so as to certainly prevent the any substantive movement of the semiconductor chip 4 particularly in the direction vertical to the surface of the semiconductor chip 4.

Namely, the presence of the electrically insulative adhesive outer tapes 3B would result in that inner leads 1 are fixed not only at the stitched portions 2 but also outside portions at the edges of the semiconductor chip 4. This structure is capable of certainly preventing a substantive movement of the semiconductor chip 4 in a direction vertical to the surface of the semiconductor chip 4 by pressure of the flow of the molten resin when the resin is injected into dies for packaging the semiconductor chip 4. The certain prevention of the substantive movement of the semiconductor chip 4 would result in a certain prevention of the inner leads 1 from being made into contact with the edges of the semiconductor chip 4. The certain prevention of the substantive movement of the semiconductor chip 4 would also result in a certain prevention of the top portion of the semiconductor device such as tops of bonding wires from exposure from the sealing resin or a package 6. The certain prevention of the substantive movement of the semiconductor chip 4 would also result in a certain prevention of the bottom portion of the semiconductor device such as the bottom surface of the inner leads 1 from exposure from the sealing resin or the package 6. The certain prevention of the substantive movement of the semiconductor chip 4 means that the above structure is also capable of keeping a constant distance between the semiconductor chip 4 and the inner lead 1 extending over the semiconductor chip 4. The certain prevention of the substantive movement of the semiconductor chip 4 also means that the structure is capable of keeping a balance in thickness between upper and lower portions of the sealing resin 6 for packaging the semiconductor chip 4 due to no substantive movement nor shift in the direction vertical to the surface of the semiconductor chip 4. Keeping the balance in thickness between upper and lower portions of the sealing resin 6 prevents formation of any thickness-reduced portion of the sealing resin 6, resulting in a remarkable reduction in the probability in appearance of crack on the thickness-reduced portion of the resin 6. From the above description, it can be understood that the above novel structure allows a high yield of manufacturing the semiconductor device and also allows the semiconductor device to have a high reliability.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A lead-on-chip structure of a semiconductor device packaged with a sealing resin, said lead-on-chip structure comprising:

a semiconductor chip having two alignments of bonding pads along opposite sides of a center line on a top surface of said semiconductor chip, said center line separating said semiconductor chip into first and second side regions;

first and second alignments of inner leads which extend over said first and second side regions of said semiconductor chip respectively so that said inner leads are spaced from said top surface of said semiconductor chip, and said inner leads having stitched portions positioned in inside terminal portions thereof, said stitched portions of said inner leads being positioned outside of said bonding pads, said inner leads extending substantially in parallel to each other and along a direction perpendicular to said center line of said semiconductor chip;

bonding wires electrically connecting said stitched portions of said inner leads to corresponding said bonding pads of said semiconductor chip; and one inner electrically insulative adhesive tape having top and bottom surfaces with adhesion force arranged on each of the first and second side regions of the semiconductor chip, said bottom surfaces of each said inner tape being positioned outside of said bonding pads, said top surfaces of each said inner tape being adhered on bottom surfaces of said stitched portions of said inner leads, at least one outer electrically insulative double-sided adhesive tape piece separate from the inner tape arranged on each of the first and second side regions of the semiconductor chip, each said outer tape piece being positioned in the vicinity of an edge of said semiconductor chip which extends substantially in parallel to said center line, wherein over each said side region at least one of said inner leads is secured by both the inner tape and one of the at least one outer tape piece.

2. The lead-on-chip structure as claimed in claim 1, wherein in each said side region the at least one outer tape piece comprises two separate pieces positioned so as to adhere only to outer-most two of said inner leads.

3. The lead-on-chip structure as claimed in claim 2, wherein said outer-most two of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

4. The lead-on-chip structure as claimed in claim 1, wherein in each said side region the at least one outer tape piece comprises two separate pieces positioned so as to adhere only to two of said inner leads which lie immediately inside of an outermost two of said inner leads.

5. The lead-on-chip structure as claimed in claim 4, wherein said inner leads which lie immediately inside of an outermost two of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

6. The lead-on-chip structure as claimed in claim 1, wherein in each said side region the at least one outer tape piece comprises two separate pieces positioned so as to adhere outer-most two and two immediately adjacent of said inner leads.

7. The lead-on-chip structure as claimed in claim 6, wherein said inner leads adhered to said outer tape pieces have spread portions which are adhered with said outer tape pieces, so as to increase an adhering area between said inner leads and said outer tape pieces and decrease a contact area between said outer tape pieces with a sealing resin material for packaging said semiconductor chip.

8. The lead-on-chip structure as claimed in claim 1, wherein in each said side region the at least one outer tape piece comprises two separate pieces positioned so as to adhere outer-most one of said inner leads and secondly outer one in an opposite side to said outer-most one.

9. The lead-on-chip structure as claimed in claim 8, wherein said outer-most one of said inner leads and said secondly outer one in an opposite side to said outer-most one of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

10. The lead-on-chip structure as claimed in claim 1, wherein in each of said first and second side regions the at least one outer tape piece comprises a single piece extending on an outer stripe region in the vicinity of and parallel to said edge of said semiconductor chip, where said outer stripe region is separated from said inner tape, and an outside edge of said each said single outer tape piece is positioned inside of said edge of said semiconductor chip.

11. The lead-on-chip structure as claimed in claim 10, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape niece with a sealing resin material for packaging said semiconductor chip.

12. The lead-on-chip structure as claimed in claim 1, wherein in each of said first and second side regions the at least one outer tape piece comprises a single piece extending on an outer stripe region along said edge of said semiconductor chip, where said outer stripe region is separated from said inner tape, and an outside edge of said each said single outer tape piece is positioned in correspondence to said edge of said semiconductor chip.

13. The lead-on-chip structure as claimed in claim 12, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape piece with a sealing resin material for packaging said semiconductor chip.

14. A chip-on-lead structure of a semiconductor device packaged with a sealing resin, said chip-on-lead structure comprising:

a semiconductor chip having a top surface which further has two alignments of bonding pads along opposite sides of a center line of said semiconductor chip, and said center line separating said semiconductor chip into first and second side regions;

first and second alignments of inner leads which extend under said first and second side regions of said semiconductor chip respectively so that said inner leads are spaced from a bottom surface of said semiconductor chip, and said inner leads having stitched portions positioned in inside terminal portions thereof, said inner leads extending substantially in parallel to each other and along a direction perpendicular to said center line of said semiconductor chip;

bonding wires electrically connecting said inner leads to corresponding said bonding pads of said semiconductor chip; and one inner electrically insulative double-sided adhesive tape arranged on each of the first and second side regions of the semiconductor chip, a top surface of each said inner tape being adhered on first and second inner stripe regions of said semiconductor chip, a bottom surface of each said inner tape being adhered on top surfaces of said stitched portions of said inner leads, at least one outer electrically insulative double-sided adhesive tape piece separate from the inner tape arranged on each of the first and second side regions of the semiconductor chip, each said outer tape piece being positioned in the vicinity of an edge of said semiconductor chip which extends substantially in parallel to said center line, wherein over each said side region at least one of said inner leads is secured by both the inner tape and one of the at least one outer tape piece.

15. The chip-on-lead structure as claimed in claim 14, wherein in each said side region the at least one outer tape piece comprises two separate pieces positioned so as to adhere only to outer-most two of said inner leads.

16. The chip-on-lead structure as claimed in claim 15, wherein said outer-most two of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

17. The chip-on-lead structure as claimed in claim 1, wherein in each said side region the at least one outer tape piece comprises two separate pieces positioned so as to adhere only to two of said inner leads which lie immediately inside of an outermost two of said inner leads.

18. The chip-on-lead structure as claimed in claim 12, wherein said inner leads which lie immediately inside of an outermost two of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

19. The chip-on-lead structure as claimed in claim 14, wherein in each said side region the at least one outer tape piece comprises two separate pieces positioned so as to adhere outer-most two and two immediately adjacent of said inner leads.

20. The chip-on-lead structure as claimed in claim 19, wherein said inner leads adhered to said outer tape pieces have spread portions which are adhered with said outer tape pieces, so as to increase an adhering area between said inner leads and said outer tape pieces and decrease a contact area between said outer tape pieces with a sealing resin material for packaging said semiconductor chip.

21. The chip-on-lead structure as claimed in claim 14, wherein in each said side region the at least one outer tape piece comprises two separate pieces positioned so as to adhere outer-most one of said inner leads and secondly outer one in an opposite side to said outer-most one.

22. The chip-on-lead structure as claimed in claim 21, wherein said outer-most one of said inner leads and said secondly outer one in an opposite side to said outer-most one of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

23. The chip-on-lead structure as claimed in claim 14, wherein in each of said first and second side regions the at least one outer tape piece comprises a single piece extending on an outer stripe region in the vicinity of and parallel to said edge of said semiconductor chip, where said outer stripe region is separated from said inner tape, and an outside edge of said each said single outer tape piece is positioned inside of said edge of said semiconductor chip.

24. The chip-on-lead structure as claimed in claim 23, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape piece with a sealing resin material for packaging said semiconductor chip.

25. The chip-on-lead structure as claimed in claim 14, wherein in each of said first and second side regions the at least one outer tape piece comprises a single piece extending on an outer stripe region along said edge of said semiconductor chip, where said outer stripe region is separated from said inner tape, and an outside edge of said each said single outer tape piece is positioned in correspondence to said edge of said semiconductor chip.

26. The chip-on-lead structure as claimed in claim 25, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape piece with a sealing resin material for packaging said semiconductor chip.

27. A lead frame comprising:
two alignments of first side inner leads and second side inner leads extending in first and second sides which are separated by a center line along a longitudinal direction of said lead frame, each of said first side inner leads and said second side inner leads having stitched portions;
first side and second side inner electrically insulative double-sided adhesive tapes adhered to the stitched portions of the first side and second side inner leads, respectively for adhering the first and second side inner leads with a semiconductor chip,
at least one outer electrically insulative double-sided adhesive tape piece adhered to each of the first side and second side inner leads separate from a respective one of the inner tape leads, each said at least one outer tape piece being located outside of said stitched portions of said inner leads in the vicinity of chip edge correspondence positions of said inner leads, where said chip edge correspondence position is previously determined to correspond to an edge of said semiconductor chip after said semiconductor chip has been adhered to said lead frame by said inner and outer electrically insulative adhesive tapes.

28. The lead frame as claimed in claim 27, wherein in each said side region the at least one outer tape piece comprises two separate pieces positioned so as to adhere only to outer-most two of said inner leads.

29. The lead frame as claimed in claim 28, wherein said outer-most two of said inner leads have spread portions which are adhered with said outer tape pieces, so as to increase an adhering area between said inner leads and said outer tape pieces, and decrease a contact area between said outer tape pieces with a sealing resin material for packaging said semiconductor chip.

30. The lead frame as claimed in claim 27, wherein in each said side region the at least one outer tape piece comprises two separate pieces positioned so as to adhere only to two of said inner leads which lie immediately inside of an outermost two of said inner leads.

31. The lead frame as claimed in claim 30, wherein said inner leads which lie immediately inside of an outermost two of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

32. The lead frame as claimed in claim 27, wherein in each said side region the at least one outer tape piece comprises two separate pieces positioned so as to adhere outer-most two and two immediately adjacent of said inner leads.

33. The lead frame as claimed in claim 32, wherein said inner leads adhered to said outer tape pieces have spread portions which are adhered with said outer tape pieces, so as to increase an adhering area between said inner leads and said outer tape pieces and decrease a contact area between said outer tape pieces with a sealing resin material for packaging said semiconductor chip.

34. The lead frame as claimed in claim 27, wherein in each said side region the at least one outer tape piece comprises two separate pieces positioned so as to adhere outer-most one of said inner leads and secondly outer one in an opposite side to said outer-most one.

35. The lead frame as claimed in claim 34, wherein said outer-most one of said inner leads and said secondly outer one in an opposite side to said outer-most one of said inner leads have spread portions which are adhered with said outer tape pieces, so as to increase an adhering area between said inner leads and said outer tape pieces and decrease a contact area between said outer tape pieces with a sealing resin material for packaging said semiconductor chip.

36. The lead frame as claimed in claim 27, wherein in each of said first and second side regions the at least one outer tape piece comprises a single piece extending on an outer stripe region in the vicinity of and parallel to said edge of said semiconductor chip, where said outer stripe region is separated from said inner tape, and an outside edge of said each said single outer tape piece is positioned inside of said edge of said semiconductor chip.

37. The lead frame as claimed in claim 36, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape piece with a sealing resin material for packaging said semiconductor chip.

38. The lead frame as claimed in claim 27, wherein in each of said first and second side regions the at least one outer tape piece comprises a single piece extending on an outer stripe region along said edge of said semiconductor chip, where said outer stripe region is separated from said inner tape, and an outside edge of said each said single outer tape piece is positioned in correspondence to said edge of said semiconductor chip.

39. The lead frame as claimed in claim 38, wherein said inner leads have spread portions which are adhered with said outer tape piece, provided that said spread portions of said adjacent two of said inner leads are separated from each other, so as to increase an adhering area between said inner leads and said outer tape piece and decrease a contact area between said outer tape piece with a sealing resin material for packaging said semiconductor chip.

* * * * *